US012745522B2

(12) United States Patent
Xiao et al.

(10) Patent No.: US 12,745,522 B2
(45) Date of Patent: Sep. 22, 2026

(54) ARRAY SUBSTRATE, DISPLAY PANEL AND DISPLAY DEVICE WITH COMPENSATION DEVICE OVERLAPPING DATA SIGNAL LINE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Xingliang Xiao, Beijing (CN); Weiyun Huang, Beijing (CN); Binyan Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 545 days.

(21) Appl. No.: 18/262,386

(22) PCT Filed: May 24, 2022

(86) PCT No.: PCT/CN2022/094770
§ 371 (c)(1),
(2) Date: Jul. 21, 2023

(87) PCT Pub. No.: WO2023/225865
PCT Pub. Date: Nov. 30, 2023

(65) Prior Publication Data

US 2024/0260347 A1 Aug. 1, 2024

(51) Int. Cl.
*H10K 59/131* (2023.01)

(52) U.S. Cl.
CPC .................................. *H10K 59/131* (2023.02)

(58) Field of Classification Search
CPC .................................................... H10K 59/131
See application file for complete search history.

(56) References Cited

U.S. PATENT DOCUMENTS

2012/0105388 A1* 5/2012 Han ....................... G09G 3/325 345/204
2014/0239270 A1* 8/2014 Ko ..................... H10K 59/1216 257/40

(Continued)

FOREIGN PATENT DOCUMENTS

CN 108648615 A 10/2018
CN 108878453 A 11/2018

(Continued)

OTHER PUBLICATIONS

PCT International Search Report (w/ English translation) and Written Opinion for corresponding PCT Application No. PCT/CN2022/094770, mailed Feb. 21, 2023, 14 pages.

*Primary Examiner* — Lex H Malsawma
(74) *Attorney, Agent, or Firm* — Dority & Manning, P.A.

(57) ABSTRACT

An array substrate includes a plurality of pixel driving circuits arranged in an array and a plurality of data signal lines that are all disposed in a display region, and a data signal line is electrically connected to a column of pixel driving circuits. The display region includes a compensation region and a non-compensation region. A plurality of compensation devices are disposed in the compensation region, and are configured to enable loads of the data signal lines to be uniform. The array substrate includes a substrate, a first gate layer and a source-drain metal layer including the data signal lines. The first gate layer includes at least one voltage stabilization plate pattern of at least one compensation device. An orthographic projection of a voltage stabilization (Continued)

plate pattern of a compensation device on the substrate is overlapped with an orthographic projection of a data signal line on the substrate.

19 Claims, 26 Drawing Sheets

(56) References Cited

U.S. PATENT DOCUMENTS

| | | | | |
|---|---|---|---|---|
| 2016/0322448 | A1* | 11/2016 | Kim | H10D 30/0321 |
| 2019/0051718 | A1 | 2/2019 | Zhang et al. | |
| 2019/0181211 | A1* | 6/2019 | Bae | G09G 3/3225 |
| 2020/0286435 | A1* | 9/2020 | Feng | G09G 3/20 |
| 2020/0294450 | A1 | 9/2020 | Kim et al. | |
| 2021/0066428 | A1 | 3/2021 | Tao | |
| 2022/0223077 | A1* | 7/2022 | Zhang | G09G 3/20 |
| 2022/0328595 | A1 | 10/2022 | Li et al. | |

FOREIGN PATENT DOCUMENTS

| | | | |
|---|---|---|---|
| CN | 109326631 | A | 2/2019 |
| CN | 109360844 | A | 2/2019 |
| CN | 109754744 | A | 5/2019 |
| CN | 209843713 | U | 12/2019 |
| CN | 112750844 | A | 5/2021 |
| CN | 110164380 | B | 6/2021 |
| CN | 113451380 | A | 9/2021 |
| CN | 214505498 | U | 10/2021 |
| CN | 214897561 | U | 11/2021 |
| WO | WO2022001410 | A1 | 1/2022 |

* cited by examiner

ARRAY SUBSTRATE, DISPLAY PANEL AND DISPLAY DEVICE WITH COMPENSATION DEVICE OVERLAPPING DATA SIGNAL LINE

CROSS-REFERENCE TO RELATED APPLICATION

This application is a national phase entry under 35 USC 371 of International Patent Application No. PCT/CN 2022/094770 filed on May 24, 2022, which is incorporated herein by reference in its entirety.

TECHNICAL FIELD

The present disclosure relates to the field of display technologies, and in particular, to an array substrate, a display panel and a display device.

BACKGROUND

A display panel includes pixels arranged in an array, and each pixel includes a plurality of sub-pixels. A sub-pixel may display a single color, e.g., red, green or blue. Pixels in each column are electrically connected to a data line. The data line provides respective data signals to the pixels, and a pixel generates a different gray scale under a control of a data signal. Full color display of the display panel is realized by adjusting the gray scales of the pixels in combination with color combination and superposition.

The display panel has an irregular shape. That is, the number of pixels in each column in the display panel is different, and accordingly, the number of pixels to which each data line is electrically connected is different.

SUMMARY

In an aspect, an array substrate is provided. The array substrate has a display region. A plurality of pixel driving circuits arranged in an array and a plurality of data signal lines are disposed in the display region, and a data signal line is electrically connected to a column of pixel driving circuits. The display region includes a compensation region and a non-compensation region. A plurality of compensation devices are disposed in the compensation region, and are configured to enable loads of the plurality of data signal lines in the display region to be uniform.

The array substrate includes a substrate, a first gate layer and a source-drain metal layer. The first gate layer is disposed on a side of the substrate. The first gate layer includes at least one voltage stabilization plate pattern of at least one compensation device each configured to receive a voltage stabilization signal. The source-drain metal layer is disposed on a side of the first gate layer away from the substrate and including the plurality of data signal lines. An orthographic projection of a voltage stabilization plate pattern of a compensation device in the at least one compensation device on the substrate is overlapped with an orthographic projection of a data signal line on the substrate.

In some embodiments, the display region includes a plurality of pixel regions, and each pixel region is provided with a pixel driving circuit therein. Each of at least one pixel region is a compensation pixel region provided with a voltage stabilization plate pattern of a compensation device in the at least one compensation device therein. The voltage stabilization plate pattern in the compensation pixel region is overlapped with a data signal line passing through the compensation pixel region, and an overlapping portion of the voltage stabilization plate pattern in the compensation pixel region and the data signal line passing through the compensation pixel region constitutes the compensation device.

In some embodiments, the at least one voltage stabilization plate pattern includes a first voltage stabilization plate pattern. The first gate layer further includes initialization signal lines. The first voltage stabilization plate pattern is electrically connected to an initialization signal line.

In some embodiments, the pixel driving circuit includes a first enable transistor and a second reset transistor. The array substrate further includes a semiconductor layer and a second gate layer. The semiconductor layer includes a plurality of active patterns. Each active pattern is located in a pixel region, and the active pattern includes at least an active layer of the first enable transistor and an active layer of the second reset transistor. The second gate layer is disposed between the semiconductor layer and the first gate layer. The second gate layer includes first gate signal lines and second gate signal lines. A first gate signal line is overlapped with the active layer of the first enable transistor, and a second gate signal line is overlapped with the active layer of the second reset transistor. An orthographic projection of the first voltage stabilization plate pattern on the substrate is located between orthographic projections of the first gate signal line and the second gate signal line on the substrate.

In some embodiments, a width of a portion of the first gate signal line located in the compensation region is less than a width of a portion of the first gate signal line located in the non-compensation region. A width of a portion of the second gate signal line located in the compensation region is less than a width of a portion of the second gate signal line located in the non-compensation region.

In some embodiments, a portion of a data signal line that is overlapped with the first voltage stabilization plate pattern serves as a first load plate pattern of a compensation device in the at least one compensation device. An area of an orthographic projection of the first voltage stabilization plate pattern on the substrate is greater than an area of an orthographic projection of the first load plate pattern on the substrate.

In some embodiments, the at least one voltage stabilization plate pattern includes a second voltage stabilization plate pattern. The source-drain metal layer further includes power supply voltage signal lines. The second voltage stabilization plate pattern is electrically connected to a power supply voltage signal line.

In some embodiments, the pixel driving circuit includes a writing transistor and a first reset transistor. The active pattern includes at least an active layer of the first reset transistor and an active layer of the writing transistor. The second gate layer includes third gate signal lines and fourth gate signal lines. A third gate signal line is overlapped with the active layer of the first reset transistor, and a fourth gate signal line is overlapped with the active layer of the writing transistor. An orthographic projection of the second voltage stabilization plate pattern on the substrate is located between orthographic projections of the third gate signal line and the fourth gate signal line on the substrate.

In some embodiments, a width of a portion of the third gate signal line located in the compensation region is less than a width of a portion of the third gate signal line located in the non-compensation region. A width of a portion of the fourth gate signal line located in the compensation region is less than a width of a portion of the fourth gate signal line located in the non-compensation region.

In some embodiments, a portion of a data signal line that is overlapped with the second voltage stabilization plate pattern serves as a second load plate pattern of a compensation device in the at least one compensation device. An area of an orthographic projection of the second voltage stabilization plate pattern on the substrate is greater than an area of an orthographic projection of the second load plate pattern on the substrate.

In some embodiments, the array substrate further has a peripheral region disposed on at least on one side of the display region. A plurality of power supple voltage signal lines are further disposed in the display region, and a power supply voltage bus and a plurality of data signal extending lines are disposed in the peripheral region. The plurality of power supply voltage signal lines extend into the peripheral region, and are electrically connected to the power supply voltage bus. The plurality of data signal lines extend into the peripheral region. Each data signal line is electrically connected to a data signal extending line, and orthographic projections of at least some of the plurality of data signal extending lines on the substrate are overlapped with an orthographic projection of the power supply voltage bus on the substrate.

In some embodiments, the pixel regions are arranged in an array, and a data signal line passes through a column of pixel regions. In a column of pixel regions in the compensation region, at least one compensation pixel region and at least one non-compensation pixel region except the at least one compensation pixel region are alternately arranged.

In some embodiments, orthographic projections of the plurality of active patterns in the semiconductor layer on the substrate are non-overlapped with at least one orthographic projection of the at least one voltage stabilization plate pattern on the substrate.

In some embodiments, the display region includes a plurality of pixel regions arranged in an array, and each pixel region is provided with a pixel driving circuit therein. In a column direction of the pixel regions arranged in the array, a dimension of a pixel region located in the compensation region is less than a dimension of a pixel region located in the non-compensation region. The plurality of data signal lines extend in the column direction, and pass through the display region. The compensation region includes at least one non-pixel region not provided with a pixel driving circuit therein. Two adjacent pixel regions in the compensation region are provided with a non-pixel region therebetween. The at least one compensation device is disposed in the at least one non-pixel region of the compensation region.

In another aspect, a display panel is provided. The display panel includes the array substrate in any one of the embodiments of the above aspect, a light-emitting device layer and an encapsulation layer. The light-emitting device layer is disposed on a side of the source-drain metal layer away from the substrate. The encapsulation layer is disposed on a side of the light-emitting device layer away from the substrate.

In yet another aspect, a display device is provided. The display device includes the display panel in the embodiment of the above another aspect.

In some embodiments, the at least one voltage stabilization plate pattern includes a first voltage stabilization plate pattern and a second voltage stabilization plate pattern. The first gate layer further includes initialization signal lines, and the source-drain metal layer further includes power supply voltage signal lines. The first voltage stabilization plate pattern is electrically connected to an initialization signal line, and the second voltage stabilization plate pattern is electrically connected to a power supply voltage signal line.

In some embodiments, the at least one voltage stabilization plate pattern includes a third voltage stabilization plate pattern located in the non-pixel region. A voltage stabilization signal wiring is further disposed in the non-pixel region, and is configured to transmit the voltage stabilization signal. The third voltage stabilization plate pattern is electrically connected to the voltage stabilization signal wiring.

In some embodiments, a portion of a data signal line that is overlapped with the third voltage stabilization plate pattern serves as a third load plate pattern of a compensation device in the at least one compensation device. An area of an orthographic projection of the third voltage stabilization plate pattern on the substrate is greater than an area of an orthographic projection of the third load plate pattern on the substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1:
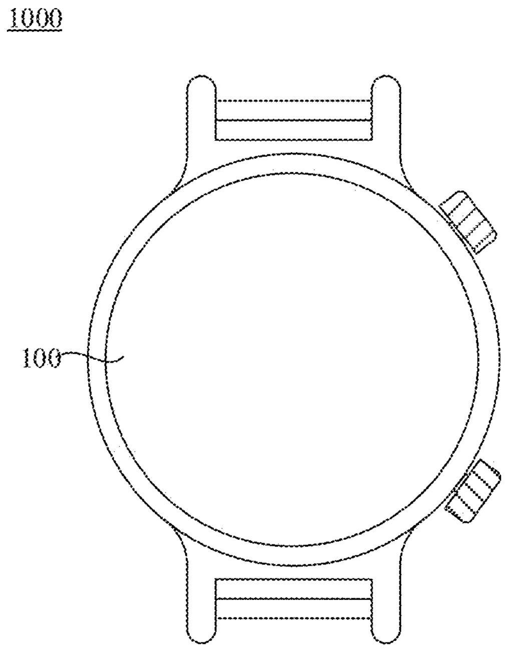
FIG. 1 is a structural diagram of a display device, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B. and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display device, and an outer contour of a display screen of the display device may include an arc. For example, the display device may be a mobile phone, a tablet computer, a personal digital assistant (PDA), a television, a vehicle-mounted computer, or a wearable display device, and a specific form of the display device is not specifically limited in the embodiments of the present disclosure. As shown in FIG. 1, the display device 1000 is a watch, and the display device 1000 includes a display panel 100. The display panel 100 is circular.

Figure 2:
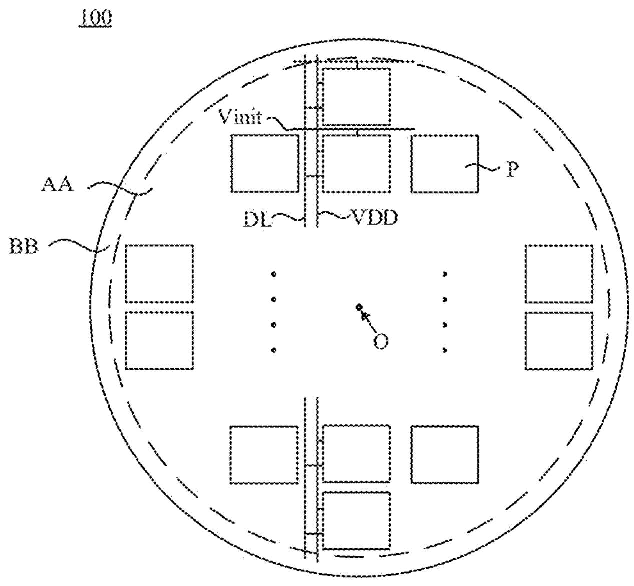
FIG. 2 is a structural diagram of a display panel, in accordance with some embodiments of the present disclosure.

In some embodiments, as shown in FIG. 2, the display panel 100 has a display region AA (i.e., active area; also referred to as an effective display region) and a peripheral region BB located on at least one side of the display region AA. A plurality of sub-pixels P arranged in an array and a plurality of signal lines are provided in the display region AA. The sub-pixel P is a minimum unit of the display panel 100 for image display, and each sub-pixel P may display a single color, such as red (R), green (G) or blue (B). By adjusting brightnesses (i.e., gray scales) of the sub-pixels P with different colors, display of a plurality of colors may be realized through color combination and superposition, thereby realizing full color display of the display panel 100.

Each of the sub-pixels P includes a light-emitting device and a pixel driving circuit for driving the light-emitting device to emit light. Pixel driving circuits included in the display panel 100 are arranged in an array.

The light-emitting device may be an organic light-emitting diode (OLED), a micro organic light-emitting diode (Micro OLED), a quantum dot light-emitting diode (QLED), a mini light-emitting diode (Mini LED), or a micro light-emitting diode (Micro LED).

In some embodiments, as shown in FIG. 2, the plurality of signal lines include a plurality of scan signal lines, a plurality of data signal lines DL, a plurality of reset signal lines, a plurality of enable signal lines, a plurality of initialization signal lines Vinit, and a plurality of power supply voltage signal lines VDD. For example, the plurality of scan signal lines, the plurality of enable signal lines and the plurality of initialization signal lines Vinit are arranged in a row direction of the sub-pixels P, and the plurality of data signal lines DL and the plurality of power supply voltage signal lines VDD are arranged in a column direction of the sub-pixels P. Each pixel driving circuit is electrically connected to a scan signal line, a data signal line DL, a reset signal line, an enable signal line, an initialization signal line Vinit and a power supply voltage signal line VDD.

Figure 3:
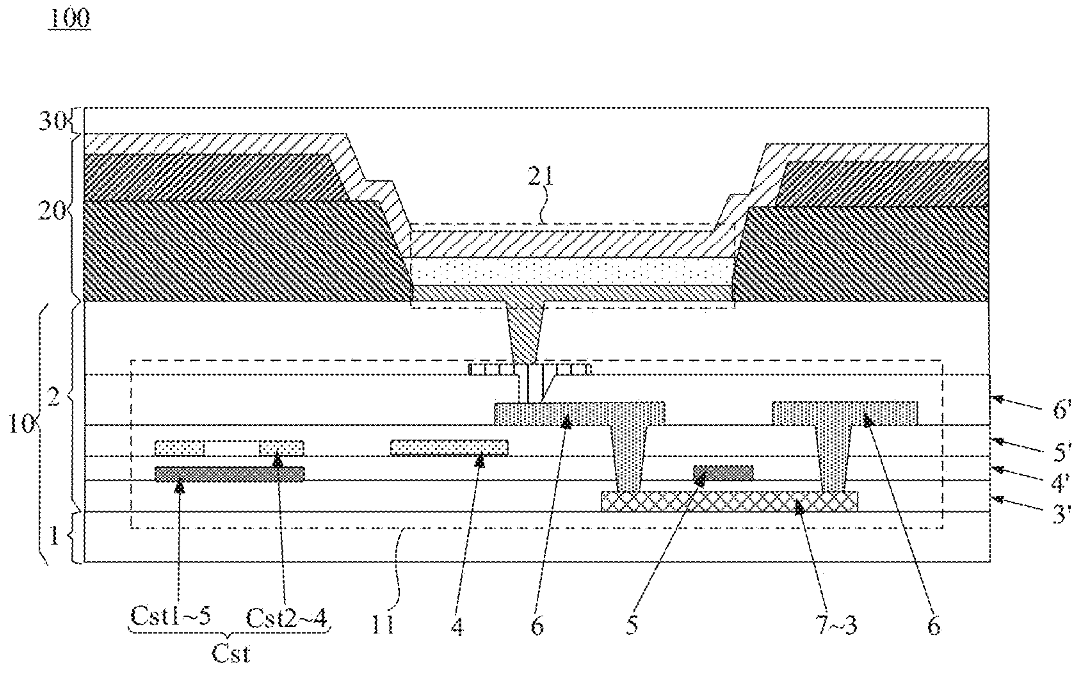
FIG. 3 is a sectional view of a display panel, in accordance with some embodiments of the present disclosure.

In some embodiments, as shown in FIG. 3, the display panel 100 includes an array substrate 10, a light-emitting device layer 20 and an encapsulation layer 30. The array substrate 10 includes the plurality of pixel driving circuits 11 arranged in the array, and the pixel driving circuit 11 includes a plurality of transistors and capacitor(s). The light-emitting device layer 20 includes a plurality of light-emitting devices 21. The array substrate 10 includes a substrate 1 and a pixel circuit layer 2 stacked on the substrate 1, and the pixel circuit layer 2 includes functional layers and insulating layer(s) each located between adjacent functional layers. The functional layers may include a semiconductor layer 3, a first gate layer 4, a second gate layer 5, a source-drain metal layer 6, and the semiconductor layer 3, the first gate layer 4, the second gate layer 5 and the source-drain metal layer 6 are used for forming the plurality of pixel driving circuits 11 in the display panel 100. The plurality of pixel driving circuits 11 may be formed in the display region of the display panel 100. The insulating layer(s) may include a first gate insulating layer 3', a second gate insulating layer 4', an interlayer dielectric layer 5' and a pixel planarization layer 6'. The first gate insulating layer 3' is disposed between the semiconductor layer 3 and the second gate layer 5. The second gate insulating layer 4' is disposed between the first gate layer 4 and the second gate layer 5. The interlayer dielectric layer 5' is disposed between the first gate layer 4 and the source-drain metal layer 6. The pixel planarization layer 6' is disposed on a side of the source-drain metal layer 6 away from the substrate 1. The light-emitting devices 21 are disposed on a side of the pixel driving circuits 11 away from the substrate 1.

The pixel driving circuit may include the plurality of transistors and the capacitor(s). For example, the transistor may be a thin film transistor, a field effect transistor (e.g., oxide thin film transistor) or other switching device with same properties. As an example, the thin film transistors are used in the embodiments of the present disclosure.

In some embodiments of the present disclosure, a control electrode of each transistor is a gate of the transistor, a first electrode of the transistor is one of a source and a drain of the transistor, and a second electrode of the transistor is another other of the source and the drain of the transistor. Since the source and the drain of the transistor may be symmetrical in structure, the source and the drain thereof may be same in structure. That is, the first electrode and the second electrode of the transistor in the embodiments of the present disclosure may be same in structure. For example, in a case where the transistor is a P-type transistor, the first electrode of the transistor is a source, and the second electrode of the transistor is a drain. For example, in a case where the transistor is an N-type transistor, the first electrode of the transistor is a drain, and the second electrode of the transistor is a source.

In some embodiments, the pixel driving circuit may be a circuit of 2T1C, 7T1C or 6T1C. T represents a transistor, a number before T represents the number of transistors, C represents a capacitor, and a number before C represents the number of capacitors. For example, 7T1C represents 7 transistors and 1 capacitor. As an example, the pixel driving circuit of 7T1C will be described.

Figure 4:
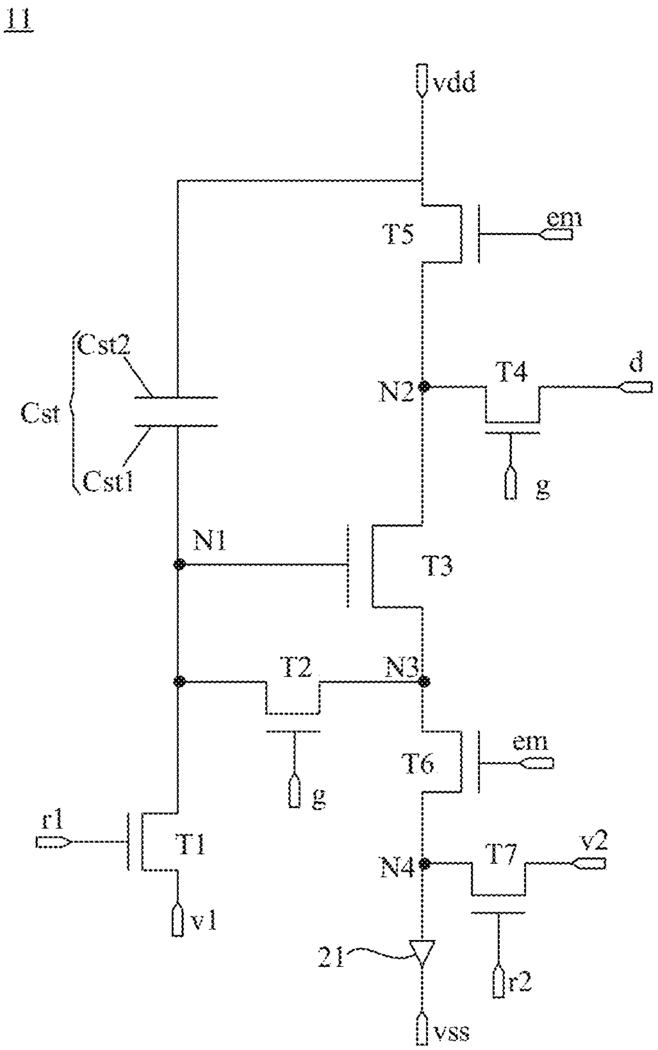
FIG. 4 is a circuit diagram of a pixel driving circuit, in accordance with some embodiments of the present disclosure.

In some examples, as shown in FIG. 4, the pixel driving circuit 11 of 7T1C includes a first reset transistor T1, a compensation transistor T2, a driving transistor T3, a writing transistor T4, a first enable transistor T5, a second enable transistor T6, a second reset transistor T7 and a first capacitor Cst.

A control electrode of the first reset transistor T1 is electrically connected to a first reset signal terminal r1, a first electrode of the first reset transistor T1 is electrically connected to a first initialization signal terminal v1, a second electrode of the first reset transistor T1 is electrically connected to a first node N1. The first reset signal terminal r1 is electrically connected to a first reset signal line in the plurality of reset signal lines, and the first initialization signal terminal v1 is electrically connected to an initialization signal line.

A control electrode of the compensation transistor T2 is electrically connected to a scan signal terminal g, a first electrode of the compensation transistor T2 is electrically connected to a third node N3, and a second electrode of the compensation transistor T2 is electrically connected to the first node N1. The scan signal terminal g is electrically connected to a scan signal line.

A control electrode of the driving transistor T3 is electrically connected to the first node N1, a first electrode of the driving transistor T3 is electrically connected to a second node N2, and a second electrode of the driving transistor T3 is electrically connected to the third node N3.

A first electrode plate Cst1 of the first capacitor Cst is electrically connected to the first node N1, a second electrode plate Cst2 of the first capacitor Cst is electrically connected to a first voltage signal terminal vdd. The first voltage signal terminal vdd is electrically connected to a first voltage signal line in the plurality of power supply voltage signal lines VDD.

A control electrode of the writing transistor T4 is electrically connected to the scan signal terminal g, a first electrode of the writing transistor T4 is electrically connected to a data signal terminal d, and a second electrode of the writing transistor T4 is electrically connected to the second node N2. The data signal terminal d is electrically connected to a data signal line.

A control electrode of the first enable transistor T5 is electrically connected to a light-emitting control signal terminal em, a first electrode of the first enable transistor T5 is electrically connected to the first voltage signal terminal vdd, and a second electrode of the first enable transistor T5 is electrically connected to the second node N2. The light-emitting control signal terminal em is electrically connected to an enable signal line.

A control electrode of the second enable transistor T6 is electrically connected to the light-emitting control signal terminal em, a first electrode of the second enable transistor T6 is electrically connected to the third node N3, and a second electrode of the second enable transistor T6 is electrically connected to an anode of a light-emitting device 21.

A control electrode of the second reset transistor T7 is electrically connected to a second reset signal terminal r2, a first electrode of the second reset transistor T7 is electrically connected to a second initialization signal terminal v2, and a second electrode of the second reset transistor T7 is electrically connected to a connection point N4 of the second electrode of the second enable transistor T6 and the anode of the light-emitting device 21. A cathode of the light-emitting device 21 is electrically connected to a second voltage signal terminal vss. The second initialization signal terminal v2 is electrically connected to an initialization signal line, the second reset signal terminal r2 is electrically connected to a second reset signal line in the plurality of reset signal lines, and the second voltage signal terminal vss is electrically connected to a second voltage signal line in the plurality of power supply voltage signal lines VDD. The second voltage signal line transmits a low level signal. For example, a voltage of the low level signal may be zero.

Figure 5A:
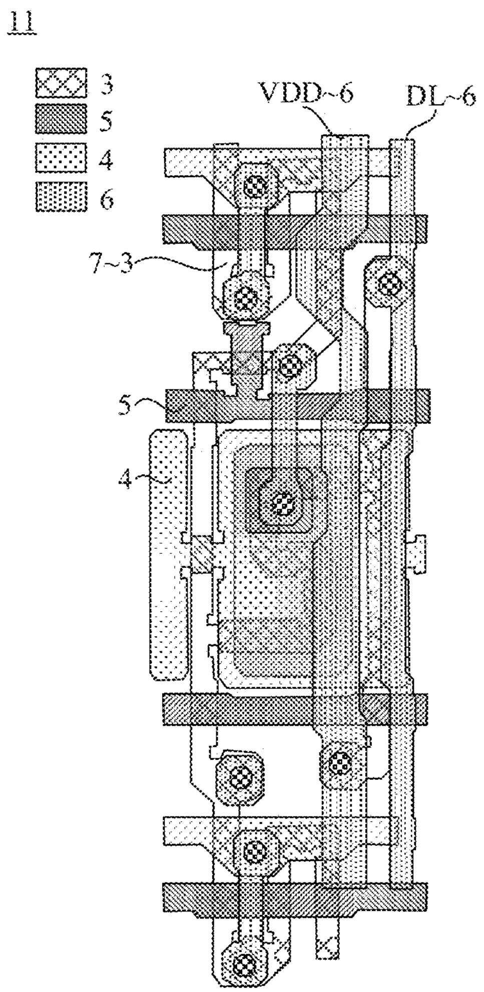
FIG. 5A is a structural diagram of a pixel driving circuit, in accordance with some embodiments of the present disclosure.
Figure 10:
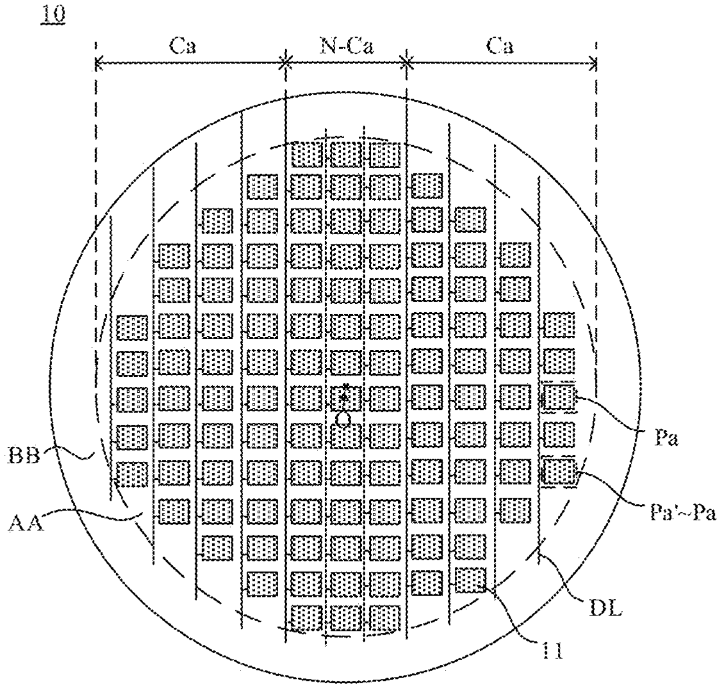
FIG. 10 is a structural diagram of yet another array substrate, in accordance with some embodiments of the present disclosure.

In some embodiments, as shown in FIG. 10, the array substrate 10 has a display region, and the display region includes a plurality of pixel regions Pa. Each pixel region Pa is provided with a pixel driving circuit 11 therein. The plurality of pixel regions Pa are arranged in an array. As shown in FIG. 5A, considering a pixel region as an example, in a layout of the pixel driving circuit 11 of 7T1C, the array substrate 10 includes the semiconductor layer 3, the first gate layer 4, the second gate layer 5 and the source-drain metal layer 6.

Figure 5B:
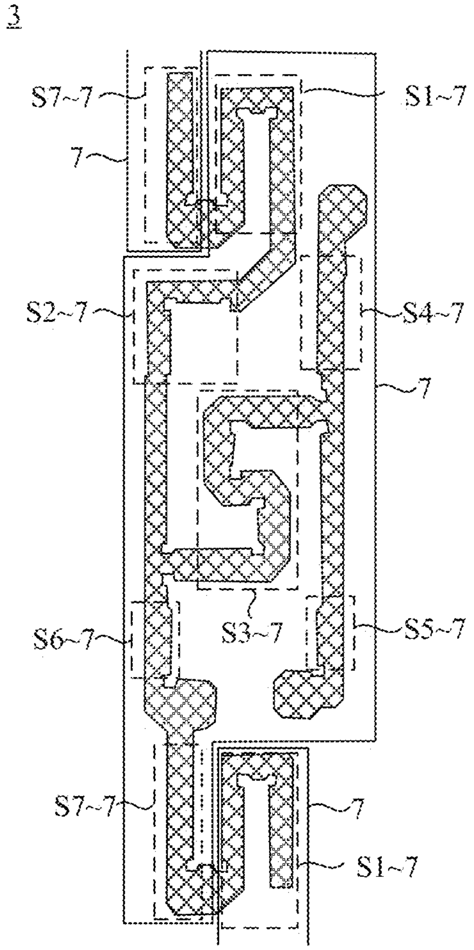
FIG. 5B is a structural diagram of an active pattern of a pixel driving circuit, in accordance with some embodiments of the present disclosure.

The semiconductor layer 3 is disposed on the substrate, and includes a plurality of active patterns 7. As shown in FIG. 5B, the active pattern 7 includes an active layer S1 of the first reset transistor, an active layer S2 of the compensation transistor, an active layer S3 of the driving transistor, an active layer S4 of the writing transistor, an active layer S5 of the first enable transistor, an active layer S6 of the second enable transistor, and an active layer S7 of the second reset transistor.

Figure 5C:
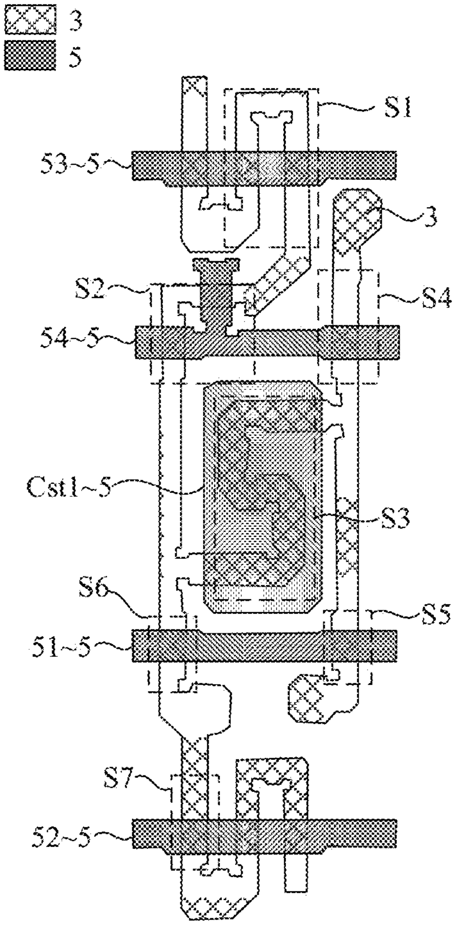
FIG. 5C is a structural diagram of an active pattern of a pixel driving circuit and a second gate layer, in accordance with some embodiments of the present disclosure.
Figure 5D:
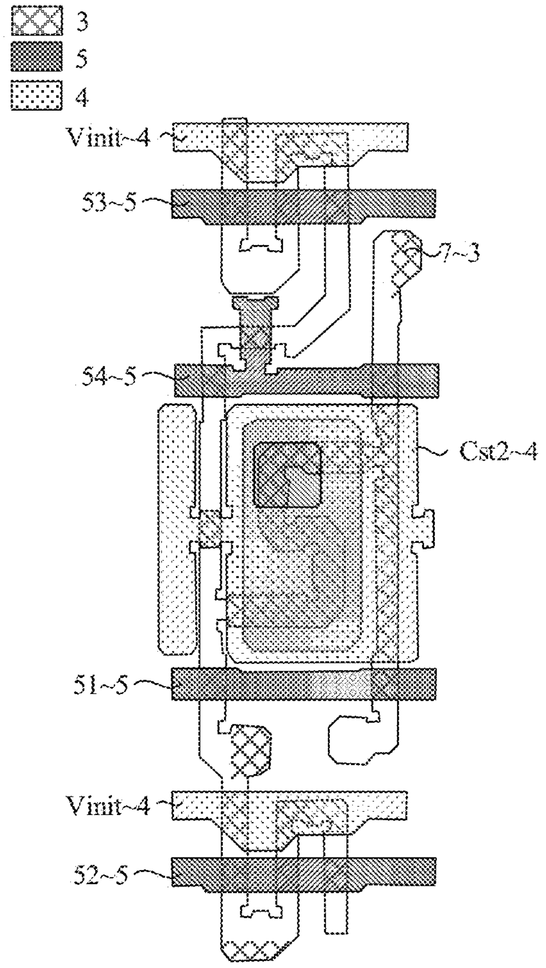
FIG. 5D is a structural diagram of an active pattern of a pixel driving circuit, a first gate layer and a second gate layer, in accordance with some embodiments of the present disclosure.

As shown in FIGS. 3 and 5D, the first gate layer 4 is disposed on a side of the substrate 1, and includes the initialization signal lines Vinit. The active layer S7 of the second reset transistor is electrically connected to the initialization signal line Vinit.

As shown in FIGS. 3 and 5C, the second gate layer 5 is disposed between the semiconductor layer 3 and the first gate layer 4. The second gate layer 5 includes first gate signal lines 51, second gate signal lines 52, third gate signal lines 53, fourth gate signal lines 54 and first electrode plates Cst1 of first capacitors. The first gate signal line 51 is overlapped with the active layer S5 of the first enable transistor to form the first enable transistor; the first gate signal line 51 is overlapped with the active layer S6 of the second enable transistor to form the second enable transistor; the second gate signal line 52 is overlapped with the active layer S7 of the second reset transistor to form the second reset transistor; the third gate signal line 53 is overlapped with the active layer S1 of the first reset transistor to form the first reset transistor; the fourth gate signal line 54 is overlapped with the active layer S2 of the compensation transistor to form the compensation transistor; the fourth gate signal line 54 is overlapped with the active layer S4 of the writing transistor to form the writing transistor; the first electrode plate Cst1 of the first capacitor is overlapped with the active layer S3 of the driving transistor to form the driving transistor.

It will be noted that in the embodiments of the present disclosure, for the entire display region of the display panel, the plurality of pixel driving circuits arranged in the array are disposed in the display region. As shown in FIG. 5B, the active layers of the transistors in each pixel driving circuit constitute an active pattern. The plurality of active patterns included in the semiconductor layer are arranged in an array, and the active patterns are periodically arranged in a column direction of an arrangement of the plurality of active patterns. As shown in FIG. 5B, an active layer S7 of a second reset transistor in an active pattern of a pixel driving circuit in a previous row and an active layer S1 of a first reset transistor in an active pattern of a pixel driving circuit in the present row are connected to each other, and have an overlapping portion in the row direction. An active layer S1 of a first reset transistor in an active pattern 7 of a pixel driving circuit in a next row and an active layer S7 of a second reset transistor in the active pattern 7 of the pixel driving circuit in the present row are connected to each other, and have an overlapping portion in the row direction. Therefore, in the layout design, the same gate signal line crosses first reset transistors T1 and second reset transistors T7 in two adjacent rows of pixel driving circuits. That is, the first reset transistors T1 and the second reset transistors T7 in the two adjacent rows of pixel driving circuits are controlled to be turned on or off by the same gate signal line.

Therefore, the display panel includes gate signal lines of three types, which are gate signal lines of a first type, gate signal lines of a second type and gate signal lines of a third type, respectively. The gate signal lines of the first type, the gate signal lines of the second type and the gate signal lines of the third type are periodically arranged. In FIG. 5C, based on a pixel region, a plurality of gate signal lines passing through the pixel region are named separately to more clearly describe positional relationships of the gate signal lines and the active layers of the transistors in the active pattern.

The gate signal line of the first type crosses active layers S2 of compensation transistors and active layers S4 of writing transistors in the same row of pixel driving circuits, and the gate signal line of the first type is the fourth gate signal line 54 in FIG. 5C. The gate signal line of the second type crosses active layers S5 of first enable transistors and active layers S6 of second enable transistors in the same row of pixel driving circuits, and the gate signal line of the second type is the first gate signal line 51 in FIG. 5C. The gate signal line of the third type crosses active layers S1 of first reset transistors and active layers S7 of second reset transistors in two adjacent rows of pixel driving circuits, and the gate signal line of the third type is the second gate signal line 52 or the third gate signal line 53 in FIG. 5C. That is, the second gate signal line 52 and the third gate signal line 53 are actually the same type of gate signal lines, and transmit the same signal.

As shown in FIG. 5A, the source-drain metal layer 6 is disposed on a side of the first gate layer 4 away from the substrate. The source-drain metal layer 6 includes the plurality of data signal lines DL and the power supply voltage signal lines VDD. The data signal line DL is configured to transmit a data signal, and the power supply voltage signal line VDD is configured to transmit a power supply voltage signal.

Figure 6:
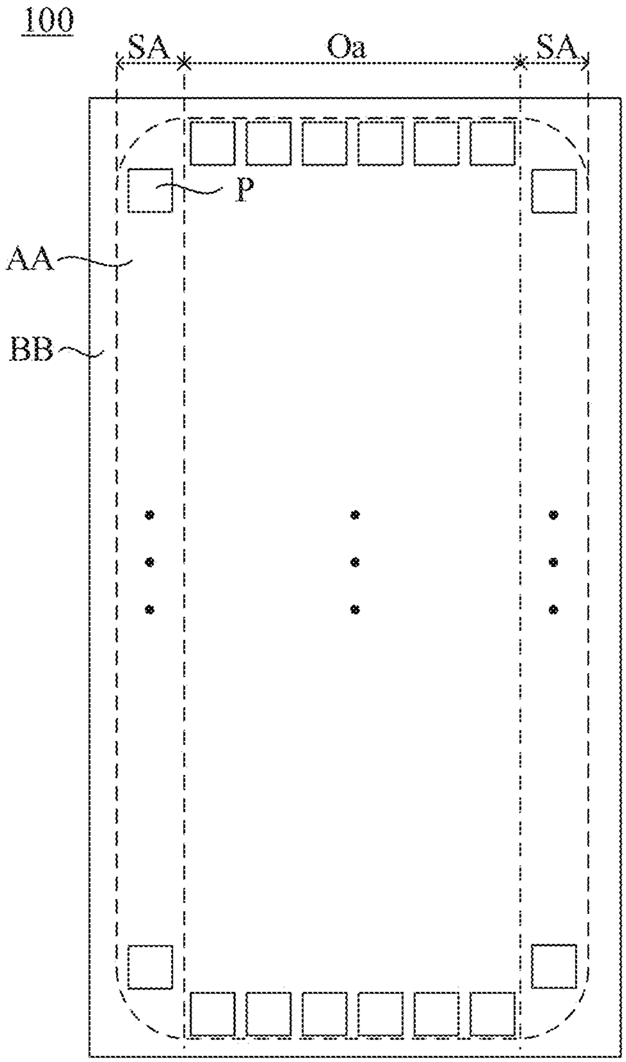
FIG. 6 is a structural diagram of another display panel, in accordance with some embodiments of the present disclosure.

In some embodiments, the shape of the display region AA is not a standard rectangle. For example, the shape of the display region AA may be a circle as shown in FIG. 2, or the shape of the display region AA may be a rounded rectangle as shown in FIG. 6. The plurality of sub-pixels P located in the display region AA are arranged in the array. In the display region AA shown in FIG. 2, the number of sub-pixels P in each column close to a center O of the display region is large, and the number of sub-pixels P in each column away from the center O of the display region is small. In the display region AA shown in FIG. 6, the number of sub-pixels P in each column in a central region Oa of the display region AA is the same, and the number of sub-pixels P in each column in each of edge regions SA that are respectively located on two sides of the central region Oa (i.e., on two opposite sides in the row direction of the sub-pixels P arranged in the array) is different. Moreover, the number of sub-pixels P in each column in the central region Oa is greater than the number of sub-pixels P in each column in the edge region SA. In the edge region SA, the number of sub-pixels P in each column is inversely proportional to a distance between this column of sub-pixels P and the central region Oa. That is, for each column of sub-pixels, as the distance from the central region Oa is increased, the number of sub-pixels P in this column is reduced.

Figure 7:
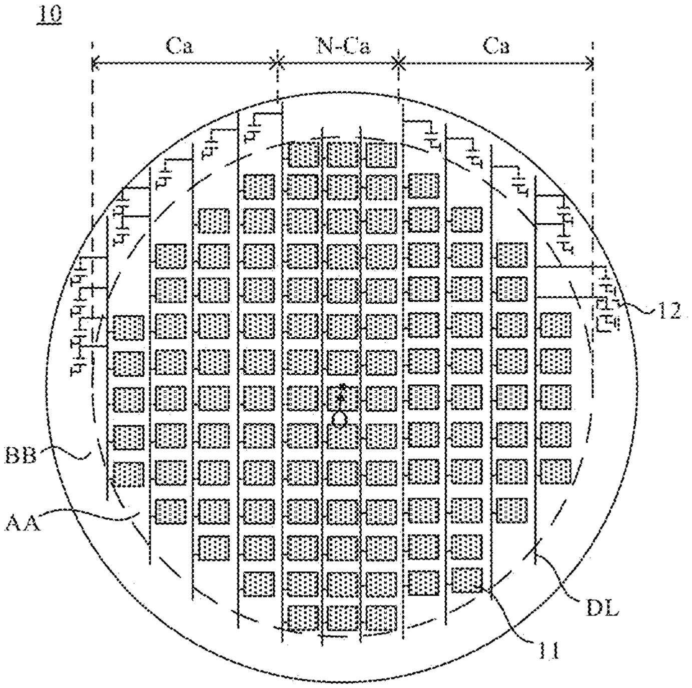
FIG. 7 is a structural diagram of an array substrate, in accordance with some embodiments of the present disclosure.
Figure 8:
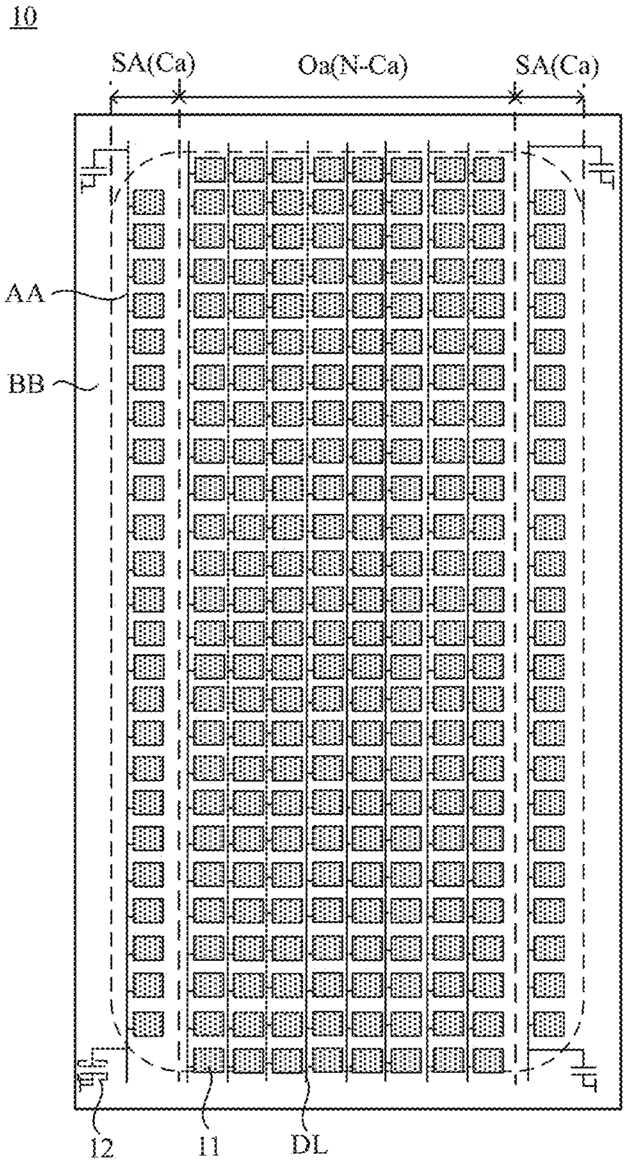
FIG. 8 is a structural diagram of another array substrate, in accordance with some embodiments of the present disclosure.

In some embodiments, as shown in FIG. 7 or 8, the array substrate 10 includes the plurality of data signal lines DL, and a data signal line DL is electrically connected to a column of pixel driving circuits 11. The number of the pixel driving circuits 11 to which each data signal line DL is electrically connected is different. As shown in FIG. 7, the farther from the center O of the display region, the lower the number of the pixel driving circuits 11 to which the data signal line DL is electrically connected. As shown in FIG. 8, the number of the pixel driving circuits to which each data signal line DL is electrically connected in the central region Oa is the same, and the number of the pixel driving circuits to which each data signal line DL is electrically connected in the edge region SA is less than the number of pixel driving circuits to which each data signal line DL is electrically connected in the central region Oa.

The number of pixel driving circuits electrically connected to a different data signal line DL is different. That is, different data signal lines DL have different loads, which may result in a following case. For example, in an example where the pixel driving circuit has P-type transistors, the same data signal is transmitted by data signal lines DL with different loads, and a gray scale of a sub-pixel electrically connected to a data signal line DL with a lower load is lower than that of a sub-pixel electrically connected to a data signal line DL with a higher load. Overall, this case may cause distortion and brightness unevenness problems in a display image of the display panel 100.

In some embodiments, in order to solve the problem of different loads of different data signal lines DL, when the number of sub-pixels to which a data signal line DL is electrically connected is small, compensation device(s) may be added to the data signal line DL. For example, the compensation device may be a resistor or a capacitor. As an example, the compensation device is a compensation capacitor in following embodiments. As shown in FIGS. 7 and 8, in order to enable the loads of the plurality of data signal lines DL in the display panel 100 to be relatively uniform and balanced, the compensation capacitor(s) 12 are added to a data signal line DL with a small number of sub-pixels connected thereto. A region of the display region AA through which the data signal lines DL each provided with the compensation capacitor(s) 12 pass is a compensation region Ca, and a region of the display region AA through which the data signal lines DL not provided with the compensation capacitor 12 pass is a non-compensation region N-Ca. Generally, the number of pixel driving circuits in each column in the non-compensation region is the same or substantially the same, and is higher than the number of pixel driving circuits in each column in the compensation region. For example, as shown in FIG. 7, the number of pixel driving circuits to which each of data signal lines DL in the non-compensation region N-Ca is connected is largest, and the number of pixel driving circuits to which each data signal line DL is connected is the same, and this data signal line DL does not need to be provided with the compensation capacitor 12. The number of pixel driving circuits to which other data signal lines DL each are electrically connected is less than the number of pixel driving circuits to which the data signal line DL in the non-compensation region N-Ca is connected. Therefore, the other data signal lines DL each need to be provided with the compensation capacitor(s) 12 for load balancing, so that the loads of all the data signal lines DL are uniform or substantially uniform. The region of the display region AA through which the data signal lines D close to the center O of the display region and each electrically connected to the same number of pixel driving circuits pass is the non-compensation region N-Ca, and the region of the display region AA through which the other data signal lines DL pass is the compensation region Ca.

As shown in FIG. 8, the number of pixel driving circuits to which each of data signal lines DL in the central region Oa is electrically connected is the same, and the number of pixel driving circuits to which each of data signal lines DL in the edge regions SA is electrically connected is less than the number of pixel driving circuits to which the data signal line DL in the central region Oa is connected, so that the load of the data signal line DL in the central region Oa is higher than the load of the data signal line DL in the edge region SA. That is, each of the data signal lines DL in the edge regions SA needs to be provided with the compensation capacitor(s) 12 for load balancing, so that the loads of all the data signal lines DL are uniform or substantially uniform. The central region Oa is the non-compensation region N-Ca, and the edge regions SA are the compensation region Ca.

That is, the array substrate 10 includes the display region AA and the peripheral region BB around the display region AA. The display region AA includes the compensation region Ca and the non-compensation region N-Ca, and the number of pixel driving circuits in each column in the non-compensation region N-Ca is the same, and is higher than the number of pixel driving circuits in each column in the compensation region Ca.

Figure 9:
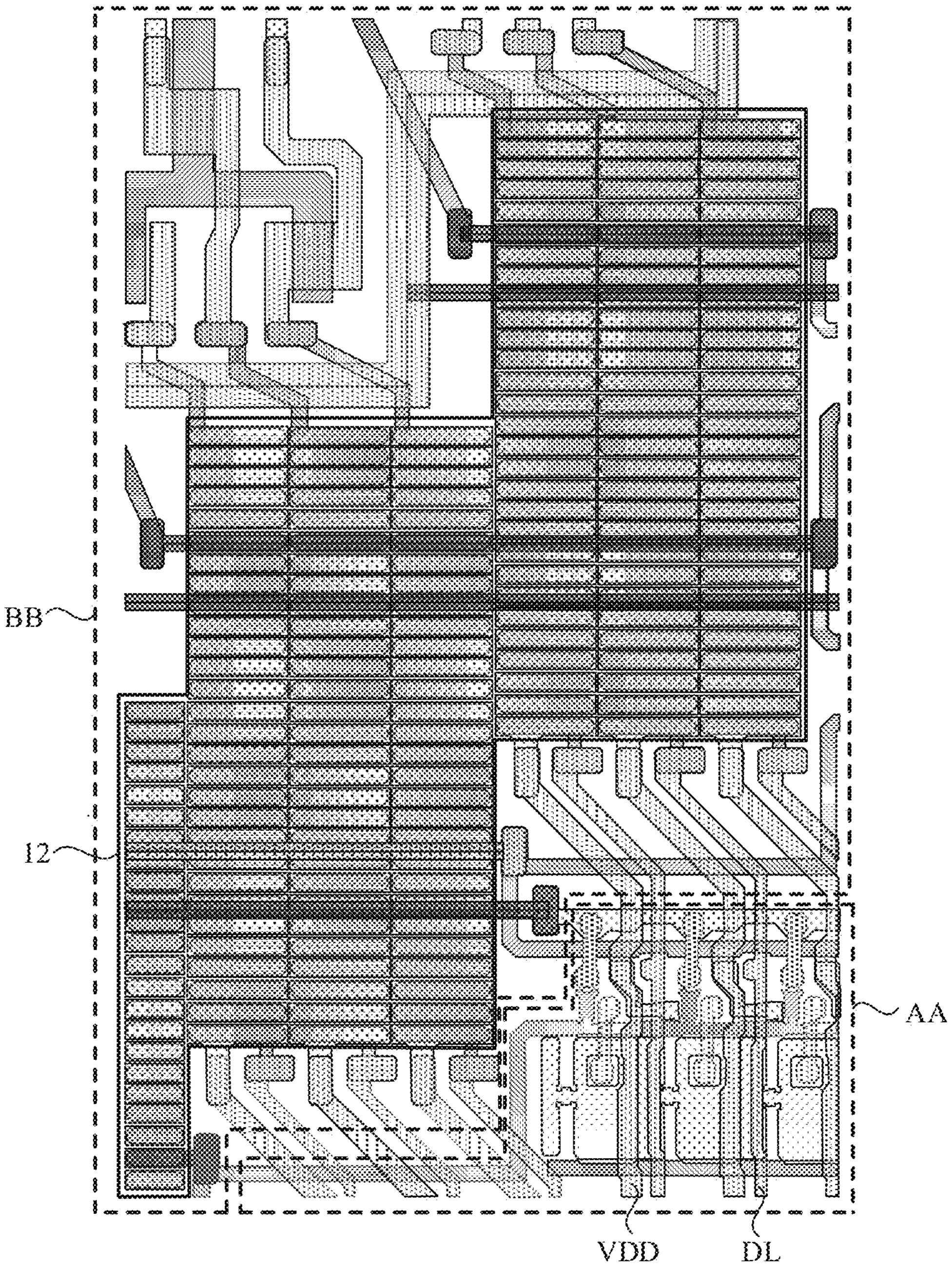
FIG. 9 is a circuit diagram in a portion of a peripheral region and a portion of a display region of an array substrate, in accordance with some embodiments of the present disclosure.

In some embodiments, as shown in FIGS. 7, 8 and 9, FIG. 9 may be a structural diagram of the array substrate 10 shown in FIG. 7 or 8 located in a portion of the display region AA and a portion of the peripheral region BB. The compensation capacitors 12 are arranged in the peripheral region BB. For example, as shown in FIG. 9, data signal lines extend into the peripheral region BB, and the array substrate further includes a metal layer disposed on a side of the source-drain metal layer where the plurality of data signal lines are located. In the peripheral region BB, the metal layer includes compensation patterns, the compensation pattern is overlapped with a data signal line that needs to be compensated, and the overlapping portion of the compensation pattern and the data signal line constitutes the compensation capacitor 12. Since the compensation capacitors 12 are arranged in the peripheral region BB, the compensation pattern occupies a large area, which is not conducive to width compression of a bezel of the display panel. Moreover, the compensation capacitor 12 occupies a space of other circuits to be arranged in the peripheral region BB. For example, the compensation capacitor 12 may occupy a space of a gate driving circuit to be arranged in the peripheral region BB, and in order to narrow the bezel of the display panel, the gate driving circuit may be compressed. Accordingly, a difficulty of a manufacturing process is increased, and product costs are increased.

Based on this, some embodiments of the present disclosure provide an array substrate 10, and the array substrate 10 includes functional layers and insulating layer(s). The functional layers include a substrate 1, a first gate layer 4, a second gate layer 5 and a source-drain metal layer 6. The insulating layer(s) include a first gate insulating layer 3', a second gate insulating layer 4', an interlayer dielectric layer 5' and a pixel planarization layer 6'. In these embodiments, the structures and positions of the functional layers and the insulating layers each disposed between the functional layers are the same as those in the above embodiments, and will not be repeated here.

Figure 11:
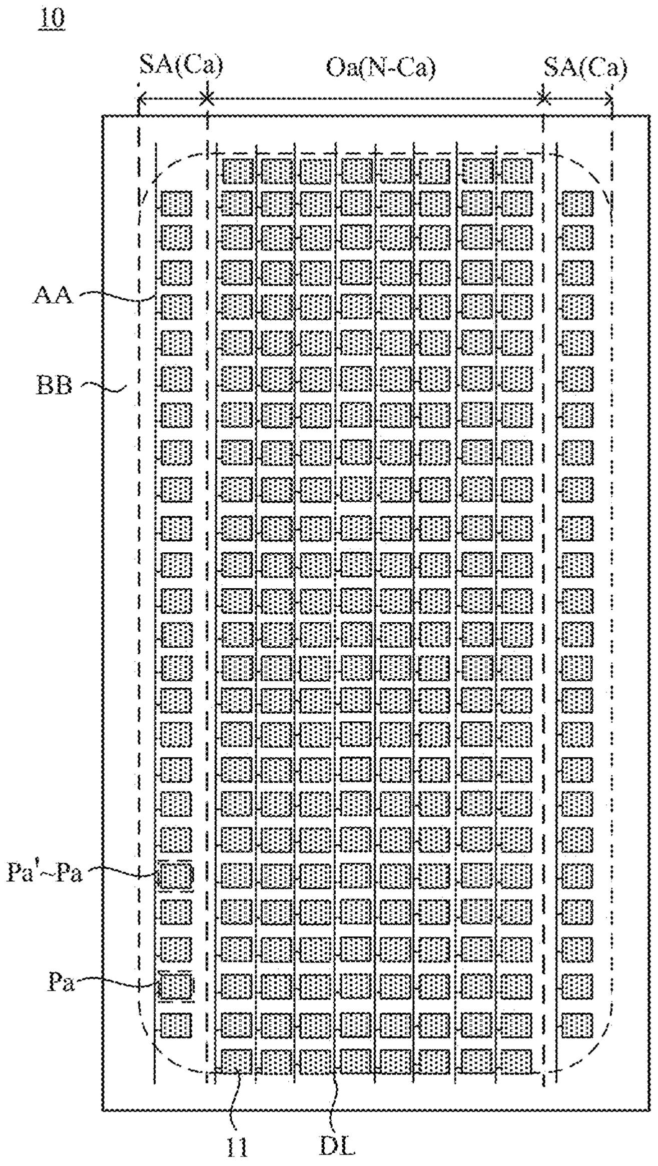
FIG. 11 is a structural diagram of yet another array substrate, in accordance with some embodiments of the present disclosure.

As shown in FIGS. 10, 11, 14, 18 and 21, FIG. 14, 18 or 21 may be a layout of a pixel driving circuit 11 in a compensation region Ca in FIG. 10 or 11. The compensation region Ca of the array substrate 10 includes a plurality of compensation capacitors 12 configured to enable loads of a plurality of data signal lines in a display region to be uniform. The first gate layer 4 includes voltage stabilization plate pattern(s) Ccs of at least one compensation capacitor 12. The voltage stabilization plate pattern Ccs is configured to receive a voltage stabilization signal. An orthographic projection of a voltage stabilization plate pattern Ccs of a compensation capacitor 12 on the substrate is overlapped with an orthographic projection of a data signal line DL on the substrate 1.

In some examples, as shown in FIG. 10, the array substrate 10 has the display region AA that is circular. The array substrate 10 includes the plurality of data signal lines DL extending in a column direction. The display region AA includes the compensation region Ca and a non-compensation region N-Ca, and boundaries of the compensation region Ca and the non-compensation region N-Ca are parallel to the column direction. A region of the display region AA through which data signal lines DL close to a center O of the display region and each electrically connected to the same number of pixel driving circuits pass is the non-compensation region N-Ca, and a region of the display region AA through which other data signal lines DL pass is the compensation region Ca. As shown in FIG. 11, the array substrate 10 has the display region AA whose shape is rounded rectangle. The array substrate 10 includes the plurality of data signal lines DL extending in the column direction. The display region AA includes the compensation region Ca and the non-compensation region N-Ca, and the boundaries of the compensation region Ca and the non-compensation region N-Ca are parallel to the column direction.

Figure 13:
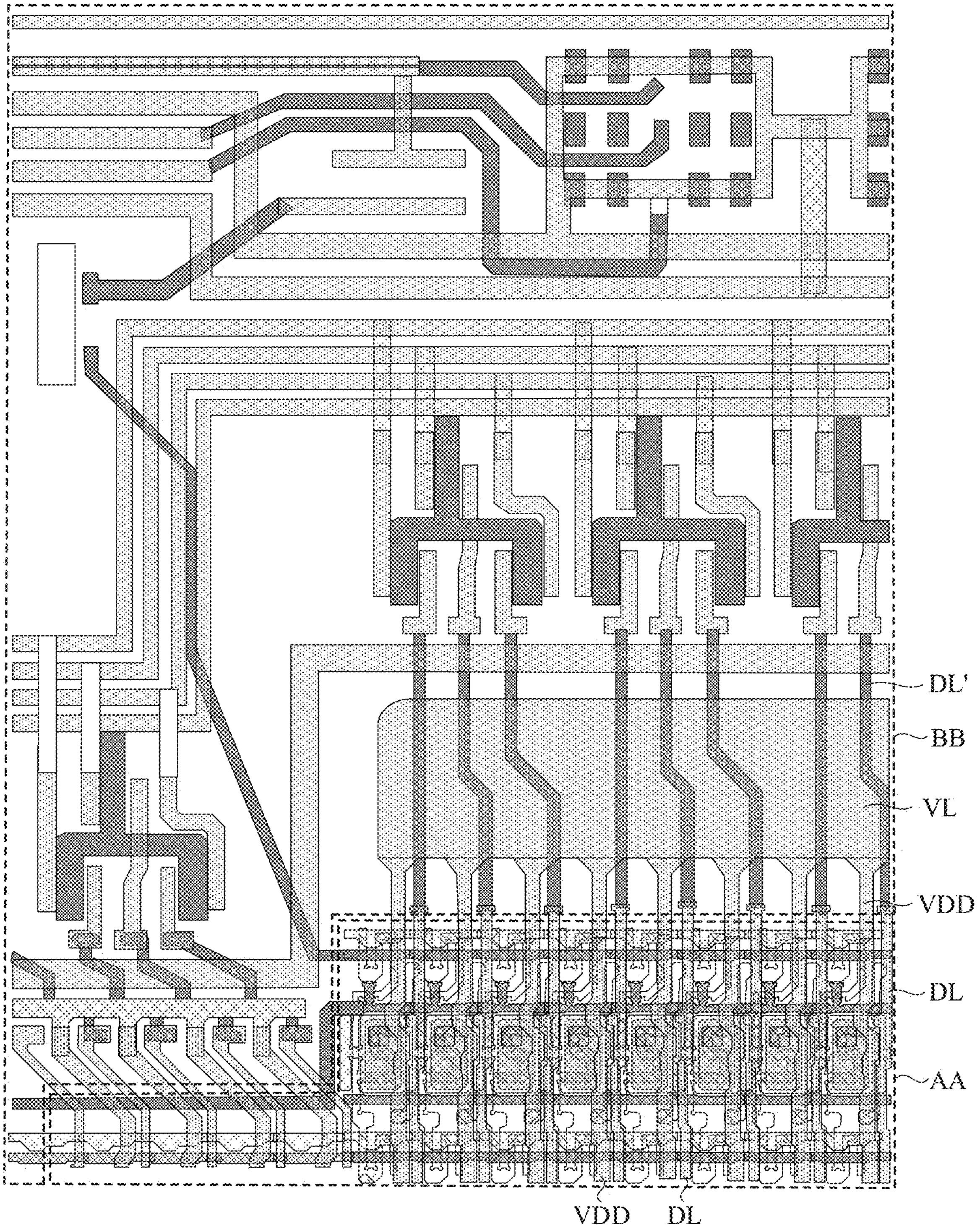
FIG. 13 is another circuit diagram in a portion of a peripheral region and a portion of a display region of an array substrate, in accordance with some embodiments of the present disclosure.

As shown in FIG. 13, the compensation capacitor is disposed in the compensation region. The voltage stabilization plate pattern Ccs of the compensation capacitor is located in a portion of the first gate layer in the compensation region, and the voltage stabilization plate pattern is overlapped with the data signal line, so that the compensation capacitor is formed at an overlapping position of the voltage stabilization plate pattern and the data signal line.

The compensation capacitor may be disposed in the compensation region, and has a function of compensating the load of the data signal line located in the compensation region, so that the loads of all the data signal lines are relatively equalized. Moreover, as shown in FIG. 13, the compensation capacitor may be disposed in the compensation region to free up a partial space of the peripheral region BB as space for other circuits, so that the process difficulty and the production costs are reduced, and the bezel width of the display panel is further reduced, thereby providing basis for the display panel with ultra-narrow bezel.

It will be noted that the phrase “overlapped with” means that orthographic projections of two on the substrate have an overlapping portion therebetween. For example, “the voltage stabilization plate pattern Ccs is overlapped with the data signal line DL”, i.e., the orthographic projection of the voltage stabilization plate pattern Ccs on the substrate is overlapped with the orthographic projection of the data signal line DL on the substrate.

In some embodiments, as shown in FIG. 13, FIG. 13 illustrates a partial structural diagram of the array substrate, which includes a structural diagram in a portion of the periphery area BB and a structure diagram in a portion of the display region AA.

The array substrate further includes the peripheral region BB disposed on at least on one side of the display region. The display region AA is further provided with a plurality of power supply voltage signal lines VDD therein, and the peripheral region BB is provided with a power supply voltage bus VL and a plurality of data signal extending lines DL' therein. The plurality of power supply voltage signal lines VDD extend into the peripheral region BB, and are electrically connected to the power supply voltage bus VL. The plurality of data signal lines DL extend into the peripheral region BB, and each data signal line DL is electrically connected to a data signal extending line DL'. Moreover, orthographic projections of at least some of the plurality of data signal extending lines DL' on the substrate are overlapped with an orthographic projection of the power supply voltage bus VL on the substrate.

For example, the plurality of data signal lines DL are arranged in the source-drain metal layer, the plurality of data signal extending lines DL' are arranged in the second gate layer, and each data signal line DL is electrically connected to a data signal extending line DL' through a via. The power supply voltage bus VL is arranged in the source-drain metal layer, and the power supply voltage bus VL is overlapped with the data signal extending line DL'. That is, the power supply voltage bus VL and the data signal extending line DL' constitute a capacitor structure, which may be used as an auxiliary compensation device with a small load for a corresponding data signal line DL. In addition to the plurality of compensation devices, the capacitor structure is able to have an auxiliary compensation function. The capacitor structure may serve as a load for the data signal line DL with a small number of pixel driving circuits connected thereto, so that the occupation of the peripheral region BB is able to be reduced, and an empty residual space in the peripheral region BB is fully utilized, thereby narrowing the bezel.

In some embodiments, as shown in FIGS. 10, 11, 17 and 20, the array substrate 10 has a plurality of pixel regions Pa, and each pixel region Pa is provided with a pixel driving circuit 11 therein. The plurality of pixel regions Pa are arranged in an array. The plurality of data signal lines DL and the plurality of power supply voltage signal lines extend in a column direction, and each data signal line DL passes through pixel regions Pa arranged in a column. The plurality of scan signal lines, the plurality of reset signal lines, the plurality of enable signal lines and the plurality of initialization signal lines Vinit extend in a row direction. Each scan signal line passes through pixel regions Pa arranged in a row, and other signal lines extending in the row direction each pass through pixel regions Pa arranged in a row.

Each of at least one pixel region Pa is a compensation pixel region Pa' provided with voltage stabilization plate pattern(s) Ccs therein. The voltage stabilization plate pattern Ccs is overlapped with a data signal line DL passing through the compensation pixel region Pa', and the overlapping portion of the voltage stabilization plate pattern Ccs and the data signal line DL constitutes the compensation capacitor 12. It will be understood that the compensation pixel region Pa' is located in the compensation region Ca.

In some examples, an outer contour of the compensation region Ca is an arc, and accordingly, the number of sub-pixels in each column in the compensation region Ca is different, i.e., the number of sub-pixels to which each data signal line DL in the compensation region Ca is electrically connected is different. That is, each data signal line DL in the compensation region Ca has a different load, so that in the compensation region Ca, the number of compensation capacitor(s) 12 with which each data signal line DL needs to be provided is different.

The compensation region Ca includes pixel regions Pa arranged in an array, and each pixel region Pa is provided with a pixel driving circuit 11 therein. Each data signal line DL passes through a column of pixel regions Pa, and in the column of pixel regions Pa, some of the pixel regions Pa each provided with compensation capacitor(s) 12 are compensation pixel regions Pa'. Each compensation pixel region Pa' is provided with at least one voltage stabilization plate pattern Ccs therein. The voltage stabilization plate pattern Ccs in the compensation pixel region Pa' is overlapped with the data signal line DL passing through the compensation pixel region Pa', and each overlapping portion is a compensation capacitor 12.

It will be noted that the phrase "pass through" means that orthographic projections of two on the substrate 1 are overlapped. For example, the data signal line DL passes through a column of pixel regions Pa, which means that an orthographic projection of the data signal line DL on the substrate 1 is overlapped with an orthographic projection of the column of pixel regions Pa on the substrate 1.

In some embodiments, as shown in FIGS. 10 and 11, the pixel regions Pa are arranged in the array, and a data signal line DL passes through a column of pixel regions Pa. In a column of pixel regions Pa in the compensation region Ca, the compensation pixel region(s) Pa' and non-compensation pixel region(s) except the compensation pixel region(s) Pa' are alternately arranged.

In some examples, the number of sub-pixels in each column in the compensation region Ca is different, and the number of compensation capacitor(s) 12 with which each data signal line DL needs to be provided is different. A compensation pixel region Pa' may be provided with one or two or three compensation capacitors 12 therein. For example, a compensation pixel region Pa' is provided with a compensation capacitor 12 therein.

Figure 12A:
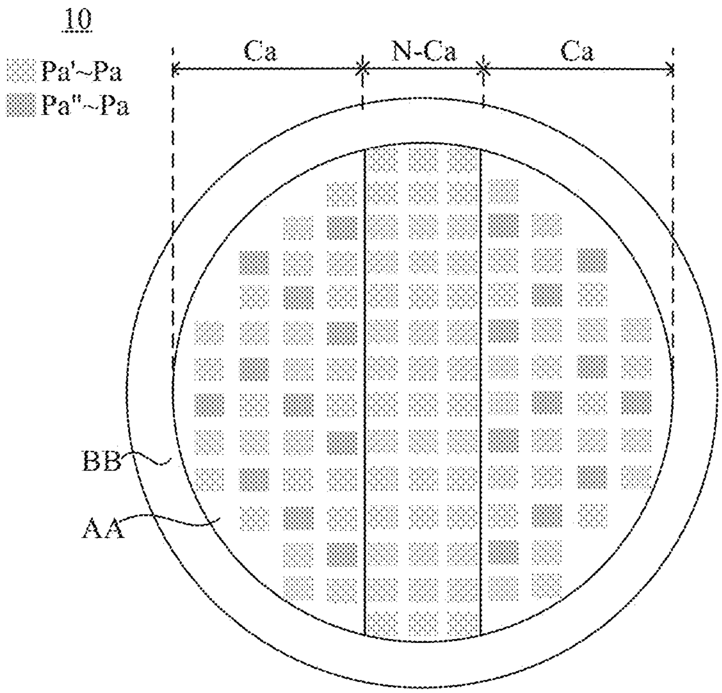
FIG. 12A is a structural diagram showing an arrangement of pixel regions, in accordance with some embodiments of the present disclosure.

For example, as shown in FIG. 12A, in a column of pixel regions Pa, two adjacent non-compensation pixel regions Pa" are provided with compensation pixel regions Pa' therebetween, and the number of compensation pixel regions Pa' between every two adjacent non-compensation pixel regions Pa" is the same.

Figure 12B:
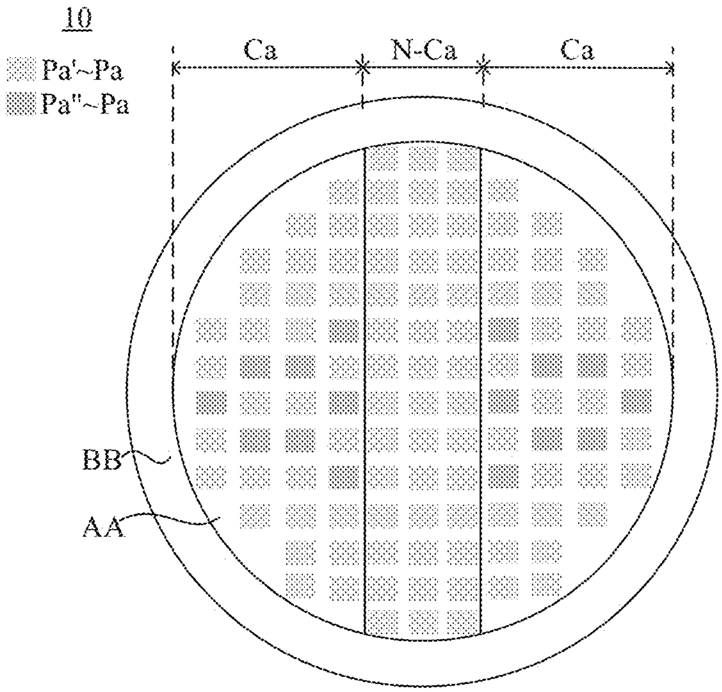
FIG. 12B is a structural diagram showing another arrangement of pixel regions, in accordance with some embodiments of the present disclosure.

Alternatively, as shown in FIG. 12B, in a middle region or two end regions of a column of pixel regions Pa, the non-compensation pixel region(s) Pa" and the compensation pixel region(s) Pa' are arranged at interval(s). For example, in the middle region of the column of pixel regions Pa, the non-compensation pixel region(s) Pa" and the compensation pixel region(s) Pa' are alternately arranged.

Figure 12C:
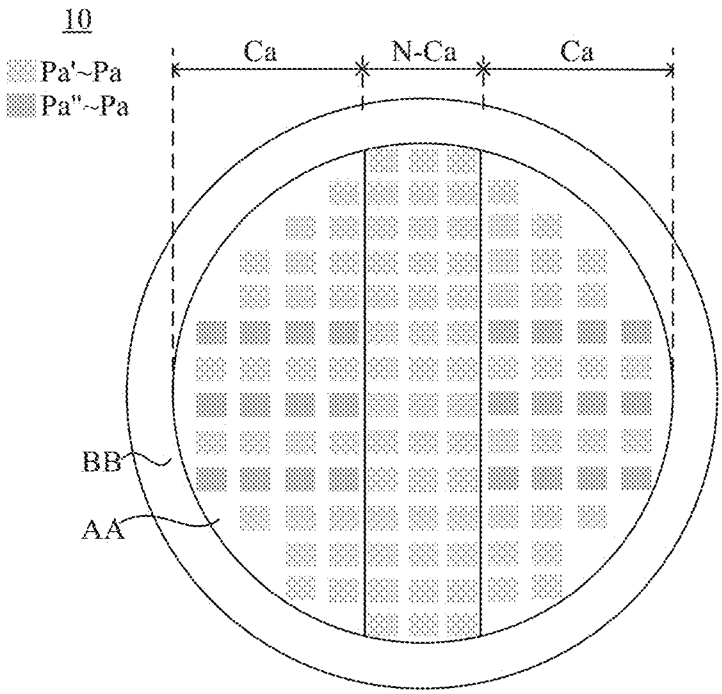
FIG. 12C is a structural diagram showing yet another arrangement of pixel regions, in accordance with some embodiments of the present disclosure.

Alternatively, as shown in FIG. 12C, in the compensation region Ca, the pixel regions Pa arranged in the array include a plurality of rows of non-compensation pixel regions Pa", and two adjacent rows of non-compensation pixel regions Pa" are provided with one or more rows of compensation pixel regions Pa' therebetween. By alternately arranging the compensation pixel region(s) and the non-compensation pixel region(s), the compensation capacitors are uniformly distributed in the compensation region of the display region.

For example, two compensation pixel regions Pa' may be provided with a non-compensation pixel region therebetween, so that the loads may be uniformly distributed to the data signal lines in the display region.

Figure 14:
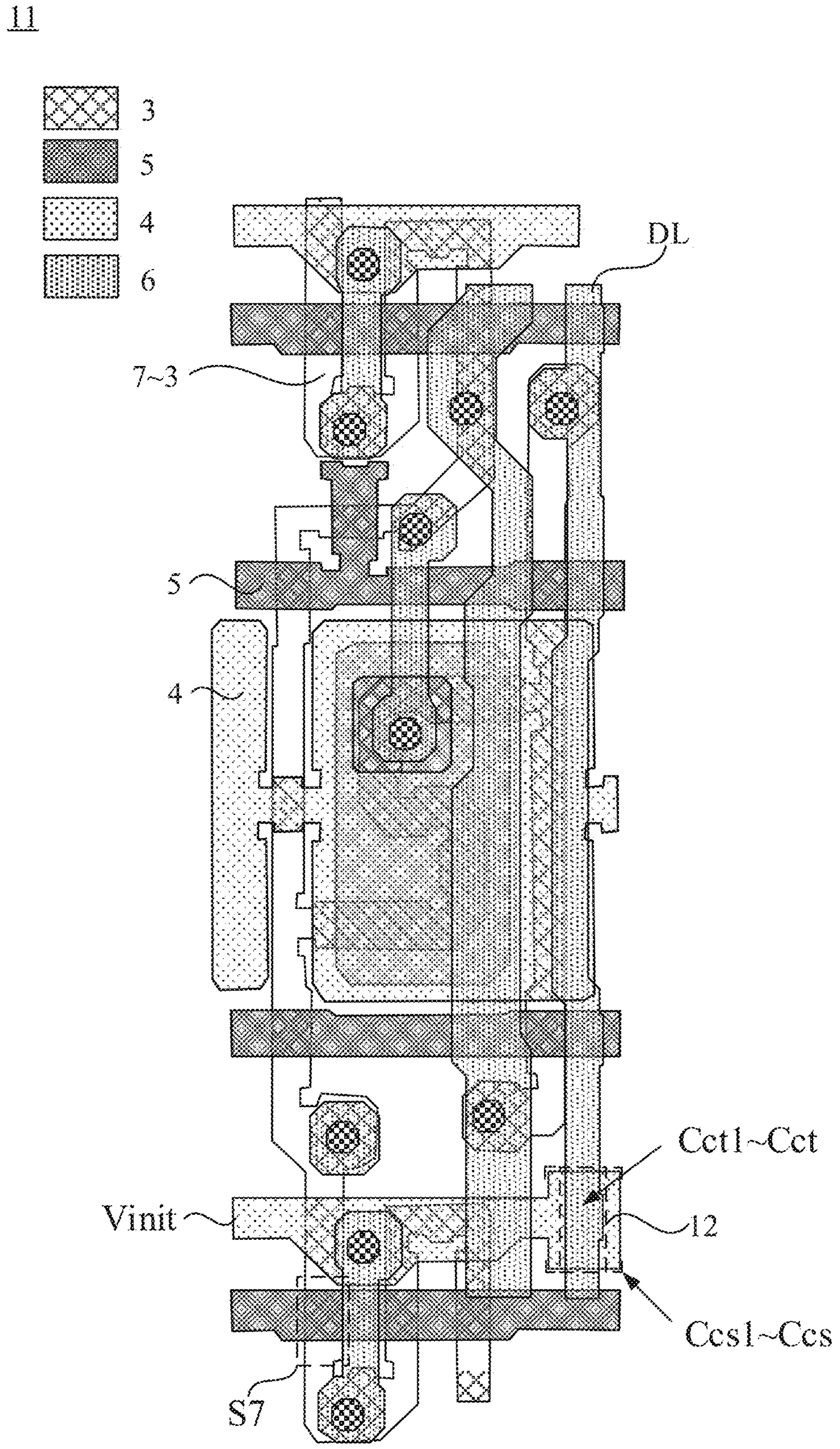
FIG. 14 is a structural diagram of another pixel driving circuit, in accordance with some embodiments of the present disclosure.
Figure 15:
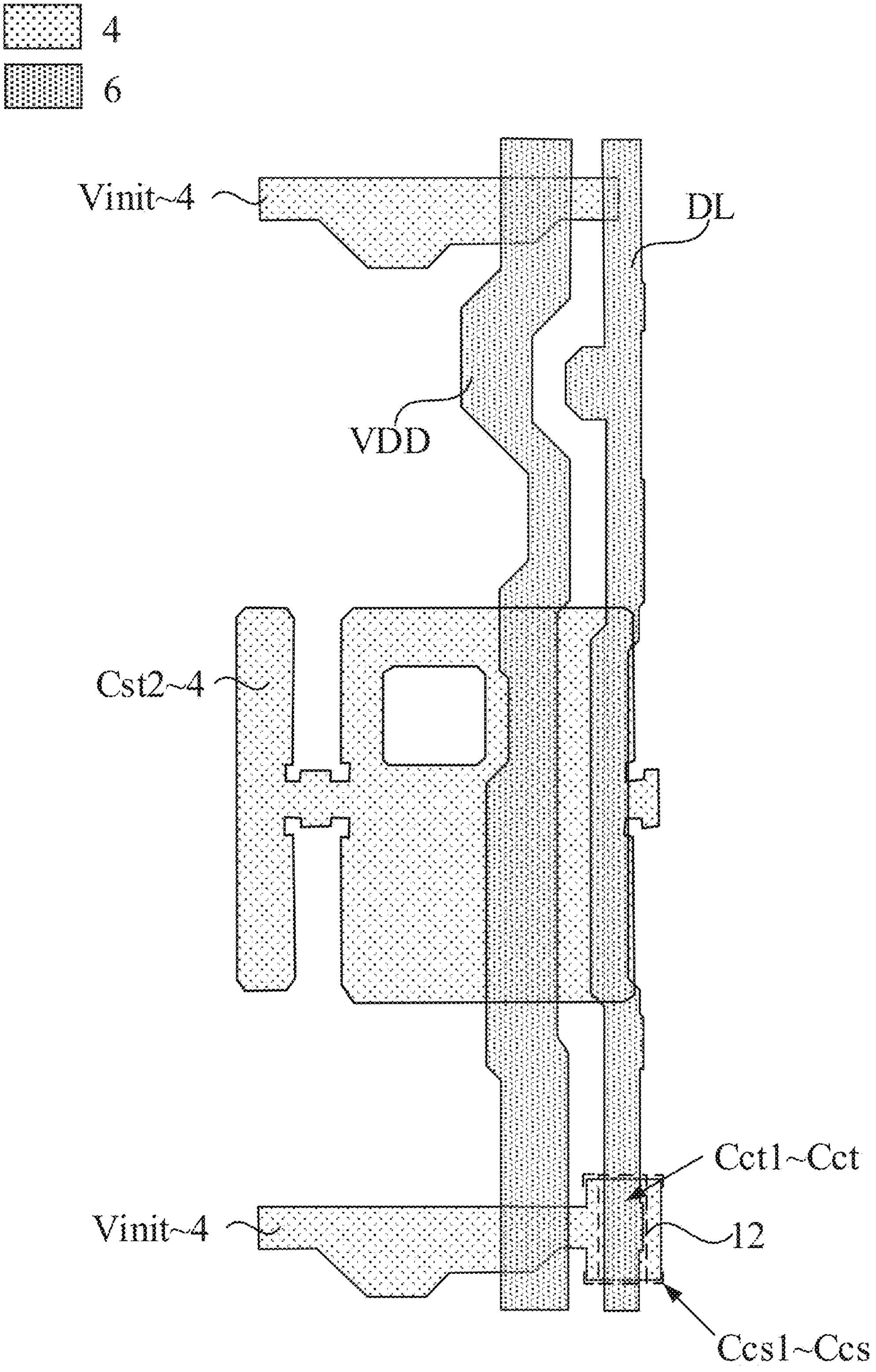
FIG. 15 is another structural diagram of a first gate layer and a source-drain metal layer in a pixel driving circuit, in accordance with some embodiments of the present disclosure.
Figure 16:
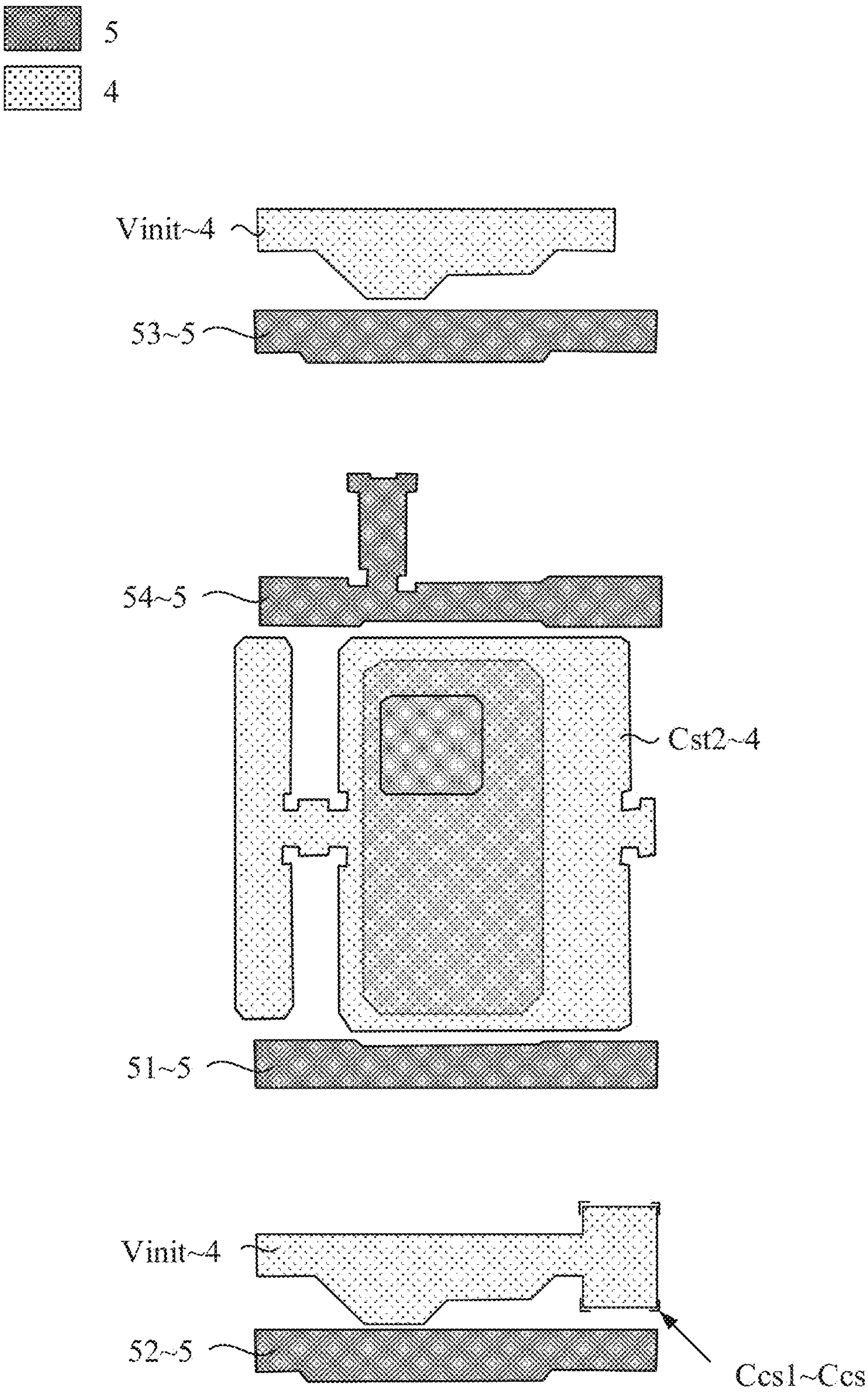
FIG. 16 is another structural diagram of a first gate layer and a second gate layer in a pixel driving circuit, in accordance with some embodiments of the present disclosure.

In some embodiments, FIGS. 14, 15 and 16 show patterns of film layers in a pixel region. FIG. 15 is a structural diagram of the first gate layer 4 and the source-drain metal layer 6 in FIG. 14, and FIG. 16 is a structural diagram of the first gate layer 4 and the second gate layer 5 in FIG. 14. The voltage stabilization plate pattern(s) Ccs include first voltage stabilization plate pattern(s) Ccs1. The semiconductor layer 3 includes the plurality of active patterns 7, and each active pattern 7 is located in a pixel region.

As shown in FIG. 14, the initialization signal line Vinit passes through the compensation pixel region to be electrically connected to the active layer S7 of the second reset transistor, and the first voltage stabilization plate pattern Ccs1 is electrically connected to the initialization signal line Vinit.

In some examples, the compensation capacitor 12 is disposed in the compensation pixel region, and the voltage stabilization plate pattern Ccs of the compensation capacitor 12 is configured to receive the voltage stabilization signal. In the pixel driving circuit 11 of 7T1C, the initialization signal line Vinit transmits an initialization signal, which is a constant voltage signal. That is, the initialization signal may be transmitted to the voltage stabilization plate pattern Ccs as the voltage stabilization signal, and the initialization signal line Vinit is further configured to transmit the voltage stabilization signal. The voltage stabilization plate pattern Ccs electrically connected to the initialization signal line Vinit is the first voltage stabilization plate pattern Ccs1, so as to achieve the purpose of receiving the voltage stabilization signal.

In the layout of the pixel driving circuit 11 of 7T1C, the initialization signal line Vinit passes through each compensation pixel region, and thus the first voltage stabilization plate pattern Ccs1 may be electrically connected to the initialization signal line Vinit in the compensation pixel region without affecting an external layout structure.

In some embodiments, as shown in FIG. 16, an orthographic projection of the first voltage stabilization plate pattern Ccs1 on the substrate is located between orthographic projections of the first gate signal line 51 and the second gate signal line 52 on the substrate 1.

In some examples, an orthographic projection of the initialization signal line Vinit on the substrate is located between the orthographic projections of the first gate signal line 51 and the second gate signal line 52 on the substrate. The first voltage stabilization plate pattern Ccs1 is electrically connected to the initialization signal line Vinit, and in order to simplify the layout of the pixel driving circuit 11, the first voltage stabilization plate pattern Ccs1 is close to the initialization signal line Vinit. That is, the first voltage stabilization plate pattern Ccs1 is arranged in the first gate layer 4, and the orthographic projection of the first voltage stabilization plate pattern Ccs1 on the substrate 1 is located between the orthographic projections of the first gate signal line 51 and the second gate signal line 52 on the substrate 1.

Figure 17:
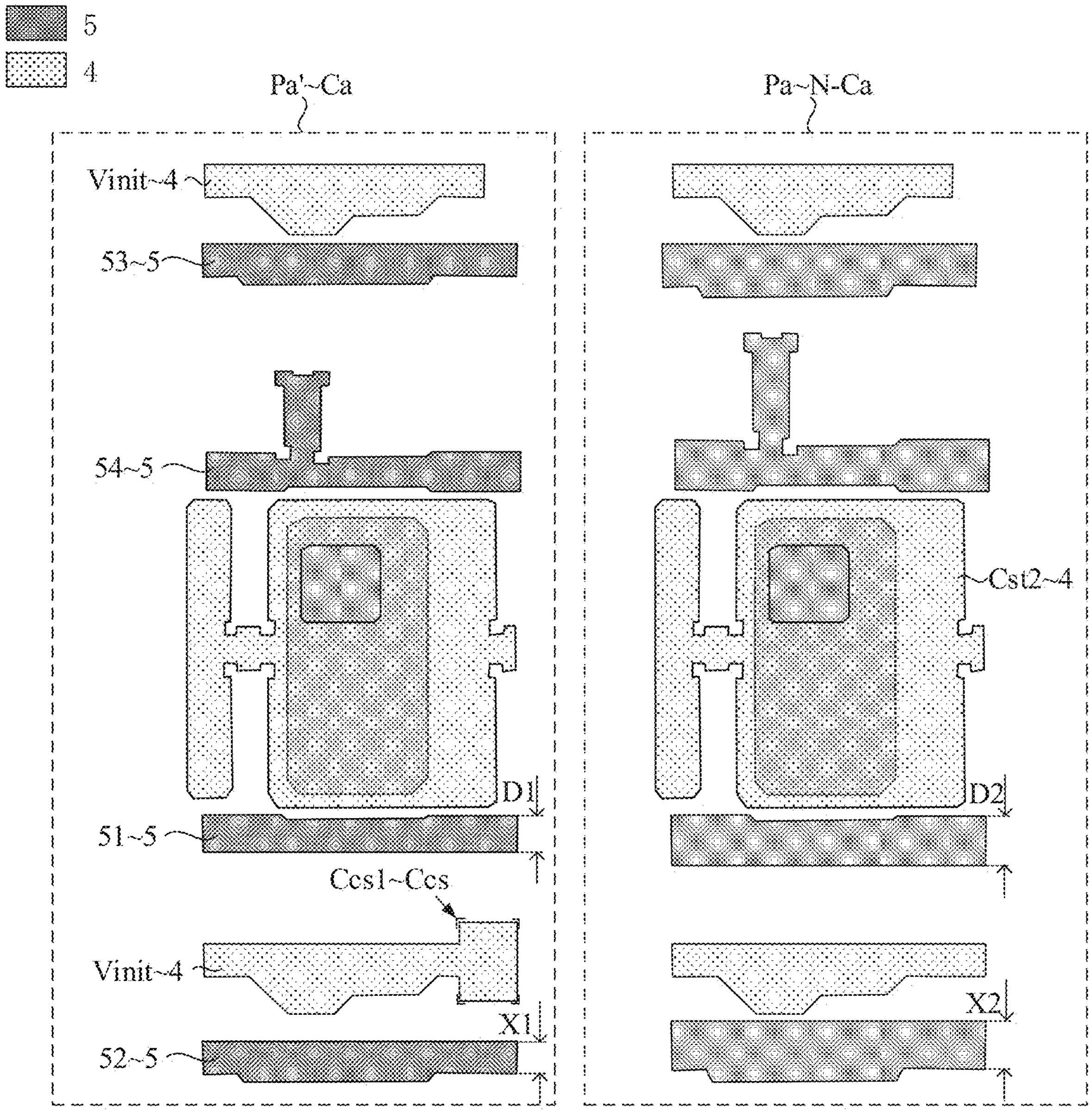
FIG. 17 is a structural diagram of a first gate layer and a second gate layer in a pixel driving circuit in a compensation region and in a pixel driving circuit in a non-compensation region, in accordance with some embodiments of the present disclosure.

In some embodiments, as shown in FIG. 17, a width D1 of a portion of the first gate signal line 51 located in the compensation region Ca is less than a width D2 of a portion of the first gate signal line 51 located in the non-compensation region N-Ca. A width X1 of a portion of the second gate signal line 52 located in the compensation region Ca is less than a width X2 of a portion of the second gate signal line 52 located in the non-compensation region N-Ca.

In some examples, a first gate signal line 51 passes through pixel regions Pa arranged in a row, and the pixel regions Pa arranged in the row include pixel regions Pa located in the compensation region Ca and pixel regions Pa located in the non-compensation region N-Ca. Moreover, the first gate signal line 51 passes through the compensation pixel region Pa'. A width of the first gate signal line 51 is a dimension of the first gate signal line 51 in a direction perpendicular to an extending direction thereof, and a portion of the first gate signal line 51 located in a different region has a different width. The width D1 of the portion of the first gate signal line 51 located in the compensation region Ca is less than the width D2 of the portion of the first gate signal line 51 located in the non-compensation region N-Ca.

A second gate signal line 52 passes through pixel regions Pa arranged in a row, and the pixel regions Pa arranged in the row include pixel regions Pa located in the compensation region Ca and pixel regions Pa located in the non-compensation region N-Ca. Moreover, the second gate signal line 52 passes through the compensation pixel region Pa'. A width of the second gate signal line 52 is a dimension of the second gate signal line 52 in a direction perpendicular to an extending direction thereof, and a portion of the second gate signal line 52 located in a different region has a different width. The width X1 of the portion of the second gate signal line 52 located in the compensation region Ca is less than the width X2 of the portion of the second gate signal line 52 located in the non-compensation region N-Ca.

The first voltage stabilization plate pattern Ccs1 is disposed between the first gate signal line 51 and the second gate signal line 52 in the compensation pixel region Pa'. In order to facilitate the arrangement of the first voltage stabilization plate pattern Ccs1, and the first voltage stabilization plate pattern Ccs1 is non-overlapped with the first gate signal line 51 and the second gate signal line 52, a larger space between the first gate signal line 51 and the second gate signal line 52 is required. In order to widen the space between the first gate signal line 51 and the second gate signal line 52, a method of reducing the width of the portion of the first gate signal line 51 in the compensation region Ca and the width of the portion of the second gate signal line 52 in the compensation region Ca may be adopted, so that the overall layout does not need to be changed greatly, and the display effect of the display panel is not affected.

In some embodiments, as shown in FIG. 15, a portion of the data signal line DL that is overlapped with the first voltage stabilization plate pattern Ccs1 serves as a first load plate pattern Cct1 of the compensation capacitor 12. An area of the orthographic projection of the first voltage stabilization plate pattern Ccs1 on the substrate is greater than an area of an orthographic projection of the first load plate pattern Cct1 on the substrate.

In some examples, the data signal line DL is overlapped with the first voltage stabilization plate pattern Ccs1. The portion of the data signal line DL that is overlapped with the first voltage stabilization plate pattern Ccs1 is the first load plate pattern Cct1 of the compensation capacitor 12. The first load plate pattern Cct1 and the first voltage stabilization plate pattern Ccs1 constitute the compensation capacitor 12, which has a function of load compensation for the data signal line DL, and is able to free up an occupied space of the peripheral region.

The area of the orthographic projection of the first voltage stabilization plate pattern Ccs1 on the substrate is greater than the area of the orthographic projection of the first load plate pattern Cct1 on the substrate. For example, the area of the orthographic projection of the first voltage stabilization plate pattern Ccs1 on the substrate is 2 times the area of the orthographic projection of the first load plate pattern Cct1 on the substrate. The area of the orthographic projection of the first voltage stabilization plate pattern Ccs1 is larger, so that the first voltage stabilization plate pattern Ccs1 has sufficient activity margin during processing, which may meet the requirement for areas of opposite portions of the two plates of the compensation capacitor 12. Moreover, the first voltage stabilization plate pattern Ccs1 may be shifted within a certain range, so that the process difficulty is able to be effectively reduced.

Figure 18:
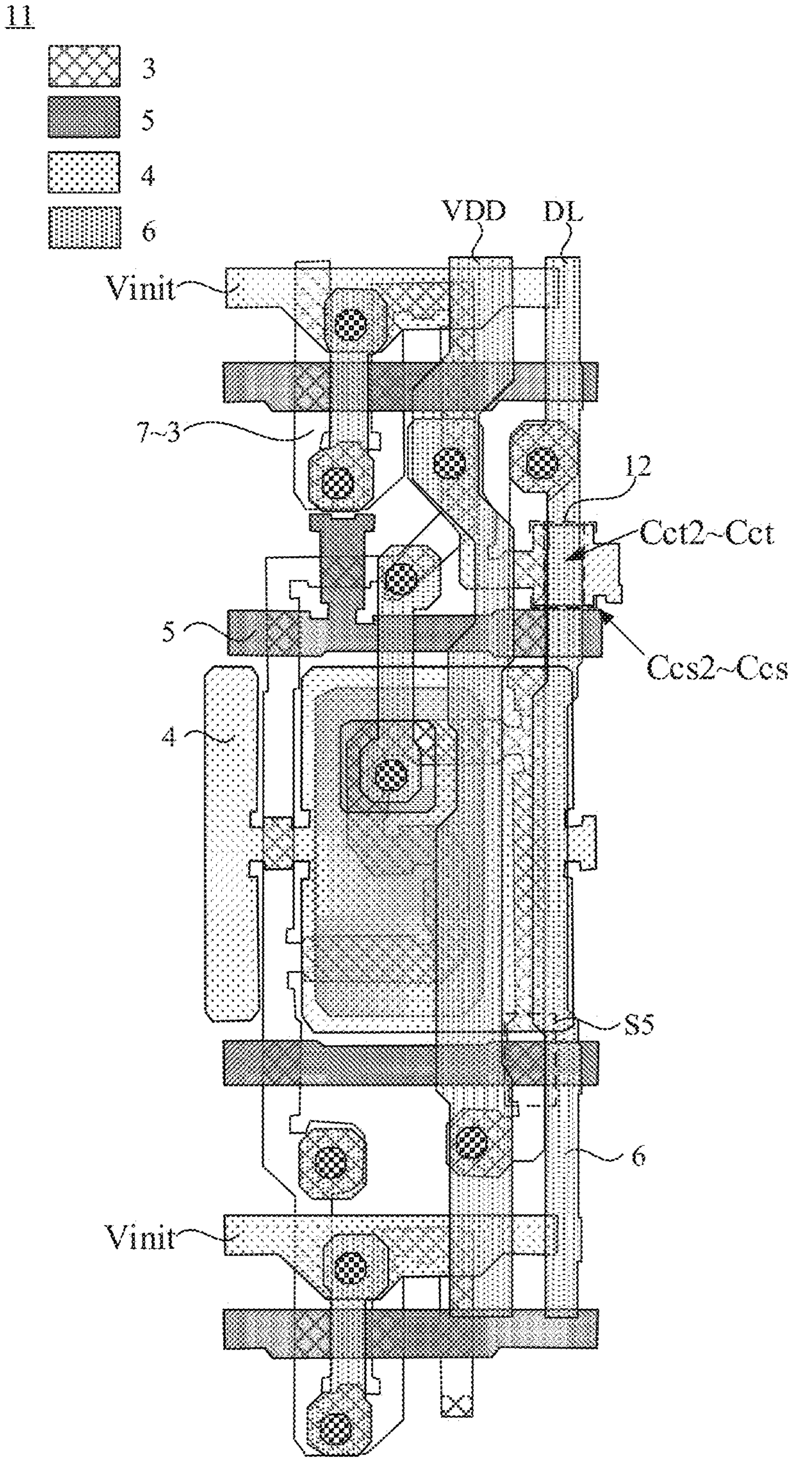
FIG. 18 is a structural diagram of yet another pixel driving circuit, in accordance with some embodiments of the present disclosure.
Figure 19:
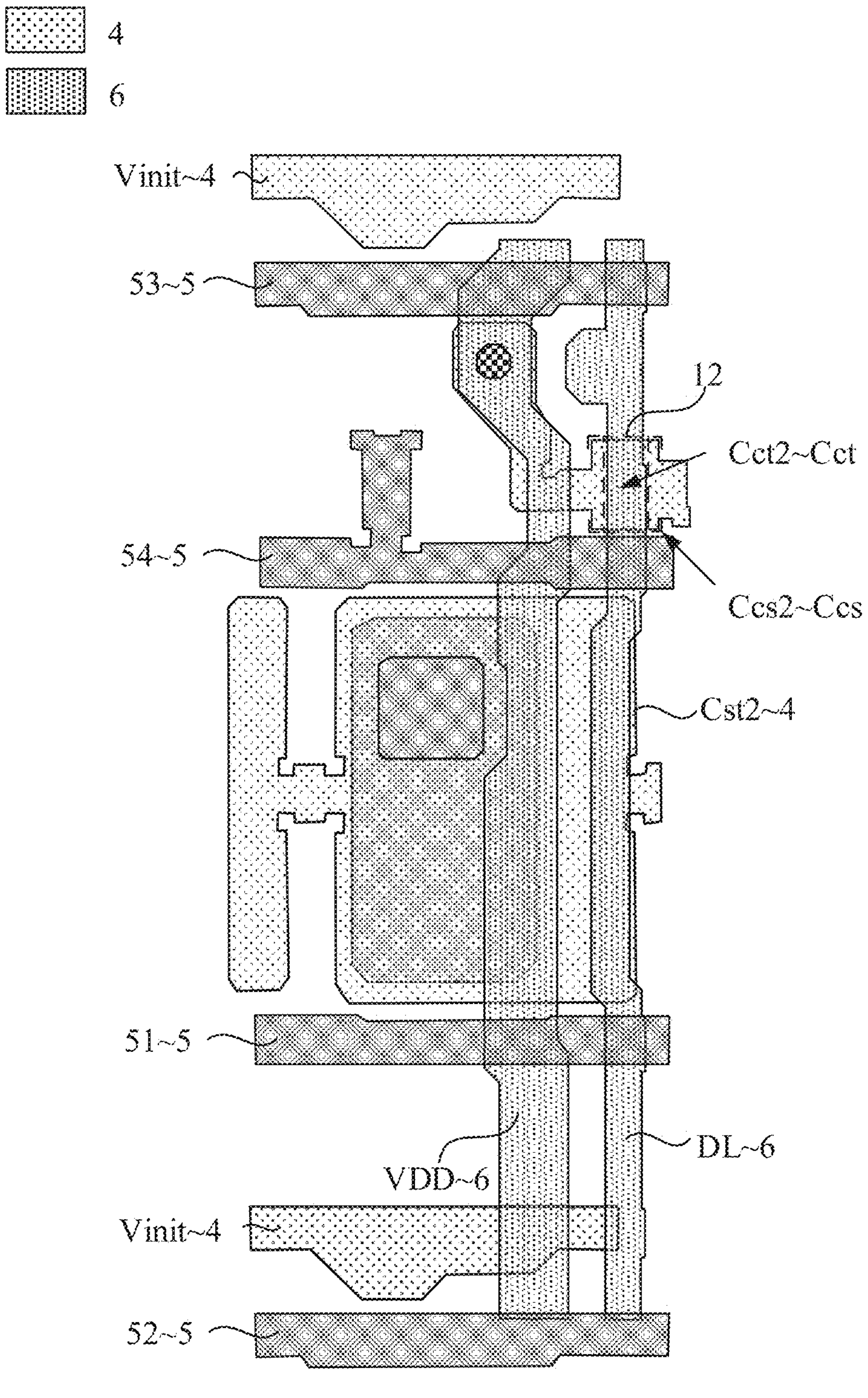
FIG. 19 is yet another structural diagram of a first gate layer and a second gate layer in a pixel driving circuit, in accordance with some embodiments of the present disclosure.

In some other embodiments, as shown in FIGS. 18 and 19, the voltage stabilization plate pattern(s) Ccs include second voltage stabilization plate pattern(s) Ccs2, and the second voltage stabilization plate pattern Ccs2 is electrically connected to a power supply voltage signal line VDD.

In some examples, the power supply voltage signal line VDD is electrically connected to the active layer S5 of the first enable transistor, and is configured to provide the power supply voltage signal, which is used as the constant voltage signal, to the pixel driving circuit. Moreover, the power supply voltage signal line VDD is electrically connected to the second voltage stabilization plate pattern Ccs2. That is, the power supply voltage signal may be transmitted as a voltage stabilization signal to the second voltage stabilization plate pattern Ccs2. That is, the power supply voltage signal line VDD is further configured to transmit the voltage stabilization signal.

The compensation capacitor 12 is disposed in the compensation pixel region, and the voltage stabilization plate pattern Ccs of the compensation capacitor 12 is configured to receive the voltage stabilization signal. The power supply voltage signal line VDD is electrically connected to the active layer S5 of the first enable transistor, and is configured to provide the power supply voltage signal to the pixel driving circuit 11, and the power supply voltage signal is the constant voltage signal. That is, the power supply voltage signal may be transmitted as the voltage stabilization signal to the voltage stabilization plate pattern Ccs. The voltage stabilization plate pattern Ccs electrically connected to the power supply voltage signal line VDD is the second voltage stabilization plate pattern Ccs2, so as to achieve the purpose of receiving the voltage stabilization signal.

In the layout of the pixel driving circuit 11 of 7T1C, the power supply voltage signal line VDD passes through each compensation pixel region, and thus the second voltage stabilization plate pattern Ccs2 may be electrically connected to the power supply voltage signal line VDD in the compensation pixel region without affecting the external layout structure.

In some embodiments, as shown in FIG. 19, an orthographic projection of the second voltage stabilization plate pattern Ccs2 on the substrate is located between orthographic projections of the third gate signal line 53 and the fourth gate signal line 54 on the substrate.

In some examples, the first gate layer 4 includes the initialization signal line Vinit, and the source-drain metal layer 6 includes a second load plate pattern Cct2 of the compensation capacitor 12. The orthographic projection of the initialization signal line Vinit on the substrate is located between the orthographic projections of the first gate signal line 51 and the second gate signal line 52 on the substrate, and the second load plate pattern Cct2 of the compensation capacitor 12 is located between the orthographic projections of the third gate signal line 53 and the fourth gate signal line 54 on the substrate. That is, a space for arranging the second voltage stabilization plate pattern Ccs2 is reserved between the third gate signal line 53 and the fourth gate signal line 54.

Figure 20:
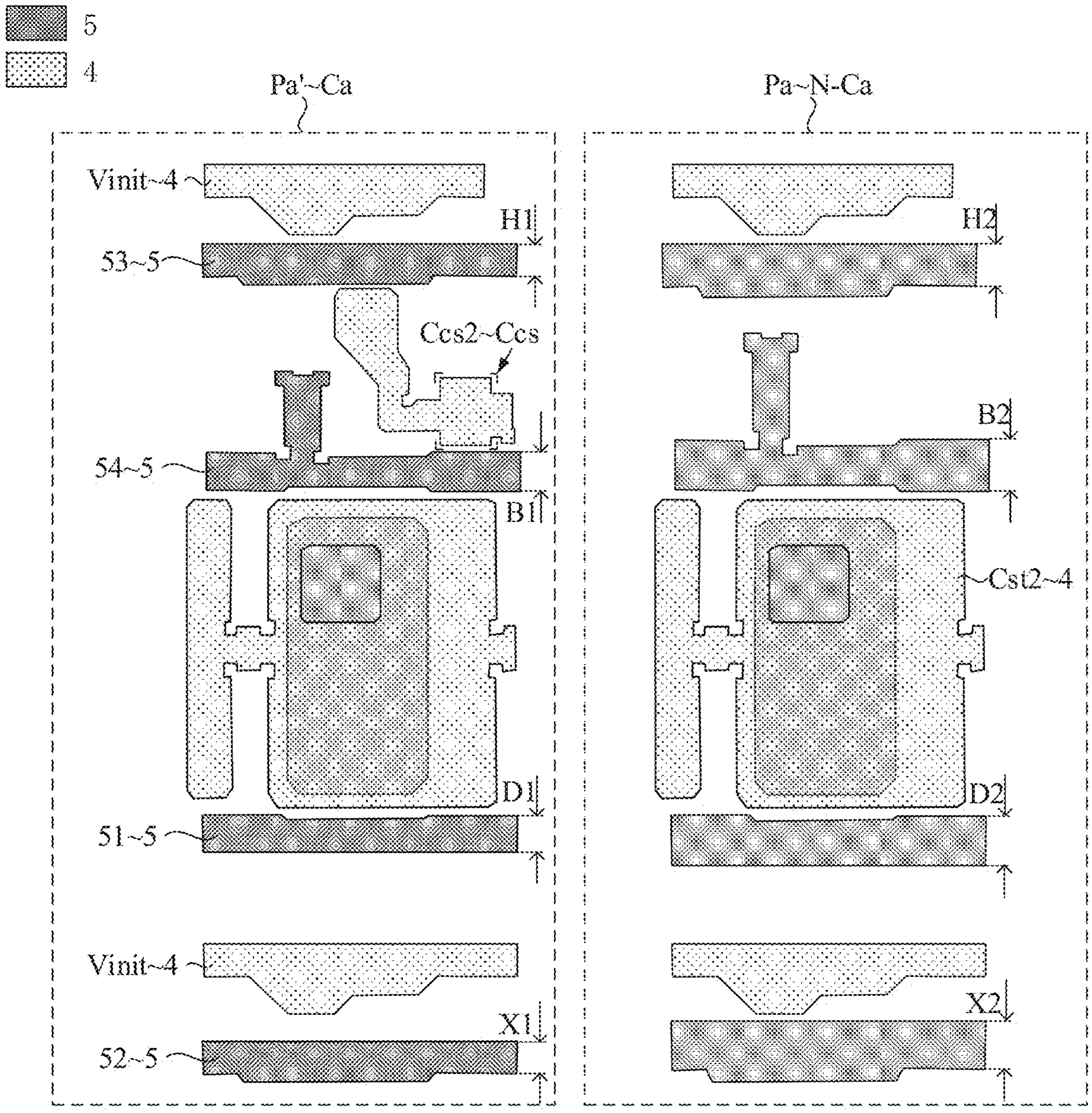
FIG. 20 is another structural diagram of a first gate layer and a second gate layer in a pixel driving circuit in a compensation region and in a pixel driving circuit in a non-compensation region, in accordance with some embodiments of the present disclosure.

As shown in FIG. 20, the second voltage stabilization plate pattern Ccs2 is disposed in the compensation pixel region Pa'. Moreover, the orthographic projection of the second voltage stabilization plate pattern Ccs2 on the substrate is located between the orthographic projections of the third gate signal line 53 and the fourth gate signal line 54 on the substrate, and is non-overlapped with the orthographic projections of the third gate signal line 53 and the fourth gate signal line 54 on the substrate.

In some embodiments, as shown in FIG. 20, a third gate signal line 53 passes through pixel regions Pa arranged in a row, and the pixel regions Pa arranged in the row include pixel regions Pa located in the compensation region Ca and pixel regions Pa located in the non-compensation region N-Ca. Moreover, the third gate signal line 53 passes through the compensation pixel region Pa'. A width of the third gate signal line 53 is a dimension of the third gate signal line 53 in a direction perpendicular to an extending direction thereof, and a portion of the third gate signal line 53 located in a different region has a different width. A width H1 of a portion of the third gate signal line 53 located in the compensation region Ca is less than a width H2 of a portion of the third gate signal line 53 located in the non-compensation region N-Ca.

A fourth gate signal line 54 passes through pixel regions Pa arranged in a row, and the pixel regions Pa arranged in the row include pixel regions Pa located in the compensation region Ca and pixel regions Pa located in the non-compensation region N-Ca. Moreover, the fourth gate signal line 54 passes through the compensation pixel region Pa'. A width of the fourth gate signal line 54 is a dimension of the fourth gate signal line 54 in a direction perpendicular to an extending direction thereof, and a portion of the fourth gate signal line 54 located in a different region has a different width. A width B1 of a portion of the fourth gate signal line 54 located in the compensation region Ca is less than a width B2 of a portion of the fourth gate signal line 54 located in the non-compensation region N-Ca.

The second voltage stabilization plate pattern Ccs2 is disposed between the third gate signal line 53 and the fourth gate signal line 54 in the compensation pixel region Pa'. In order to facilitate the arrangement of the second voltage stabilization plate pattern Ccs2, and the second voltage stabilization plate pattern Ccs2 is non-overlapped with the third gate signal line 53 and the fourth gate signal line 54, a larger space between the third gate signal line 53 and the fourth gate signal line 54 is required. In order to widen the space between the third gate signal line 53 and the fourth gate signal line 54, a method of reducing the width of the portion of the third gate signal line 53 in the compensation region Ca and the width of the portion of the fourth gate signal line 54 in the compensation region Ca may be adopted, so that the overall layout does not need to be changed greatly, and the display effect of the display panel is not affected.

In some embodiments, as shown in FIG. 19, a portion of the data signal line DL that is overlapped with the second voltage stabilization plate pattern Ccs2 serves as the second load plate pattern Cct2 of the compensation capacitor 12. An area of the orthographic projection of the second voltage stabilization plate pattern Ccs2 on the substrate is greater than an area of an orthographic projection of the second load plate pattern Ccs2 on the substrate.

In some examples, the data signal line DL is overlapped with the second voltage stabilization plate pattern Ccs2. The portion of the data signal line DL that is overlapped with the second voltage stabilization plate pattern Ccs2 is the second load plate pattern Cct2 of the compensation capacitor 12. The second load plate pattern Cct2 and the second voltage stabilization plate pattern Ccs2 constitute the compensation capacitor 12, which has a function of load compensation for the data signal line DL, and is able to free up the occupied space of the peripheral region.

The area of the orthographic projection of the second voltage stabilization plate pattern Ccs2 on the substrate is greater than the area of the orthographic projection of the second load plate pattern Cct2 on the substrate. For example, the area of the orthographic projection of the second voltage stabilization plate pattern Ccs2 on the substrate is 2 times the area of the orthographic projection of the second load plate pattern Cct2 on the substrate. The area of the orthographic projection of the second voltage stabilization plate pattern Ccs2 is larger, so that the second voltage stabilization plate pattern Ccs2 has sufficient activity margin during processing, which may meet the requirement for areas of opposite portions of the two plates of the compensation capacitor 12. Moreover, the second voltage stabilization plate pattern Ccs2 may be shifted within a certain range, so that the process difficulty is able to be effectively reduced.

In some embodiments, as shown in FIGS. 14 and 18, orthographic projections of the plurality of active patterns 7 in the semiconductor layer 3 on the substrate are non-overlapped with the orthographic projection of the voltage stabilization plate pattern Ccs on the substrate.

In some examples, in order to avoid interaction between the compensation capacitor 12 and the active layer of each transistor, the orthographic projection of the voltage stabilization plate pattern Ccs on the substrate is non-overlapped with the orthographic projections of the plurality of active patterns 7 in the semiconductor layer 3 on the substrate.

For example, the voltage stabilization plate pattern Ccs may be the first voltage stabilization plate pattern Ccs1. The orthographic projection of the first voltage stabilization plate pattern Ccs1 on the substrate is located between the orthographic projections of the first gate signal line 51 and the second gate signal line 52 on the substrate 1. Moreover, the orthographic projection of the first voltage stabilization plate pattern Ccs1 on the substrate is non-overlapped with orthographic projections of the active layer of the first enable transistor, the active layer of the second enable transistor, and the active layer S7 of the second reset transistor on the substrate.

Alternatively, the voltage stabilization plate pattern Ccs may be the second voltage stabilization plate pattern Ccs2. The orthographic projection of the second voltage stabilization plate pattern Ccs2 on the substrate is located between the orthographic projections of the third gate signal line 53 and the fourth gate signal line 54 on the substrate. Moreover, the orthographic projection of the second voltage stabilization plate pattern Ccs2 on the substrate is non-overlapped with orthographic projections of the active layer of the first reset transistor, the active layer of the compensation transistor, and the active layer of the writing transistor on the substrate.

Figure 21:
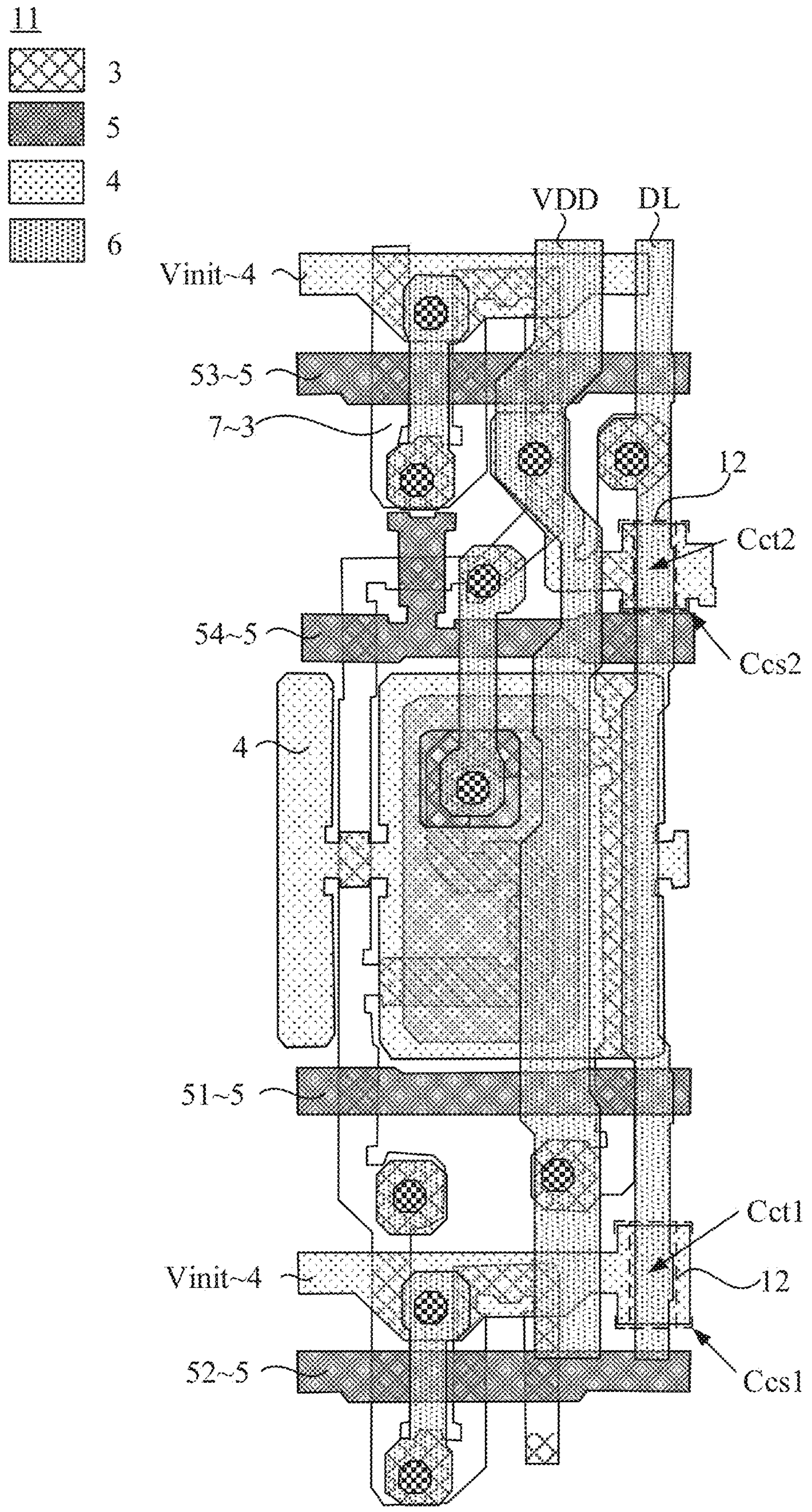
FIG. 21 is a structural diagram of yet another pixel driving circuit, in accordance with some embodiments of the present disclosure.

In some other embodiments, as shown in FIG. 21, two compensation capacitors 12 may be disposed in the compensation pixel region, and the voltage stabilization plate pattern(s) Ccs include the first voltage stabilization plate pattern(s) Ccs1 and the second voltage stabilization plate pattern(s) Ccs2. The orthographic projection of the first voltage stabilization plate pattern Ccs1 on the substrate is located between the orthographic projections of the first gate signal line 51 and the second gate signal line 52 on the substrate. The orthographic projection of the second voltage stabilization plate pattern Ccs2 on the substrate is located between the orthographic projections of the third gate signal line 53 and the fourth gate signal line 54 on the substrate.

Figure 22:
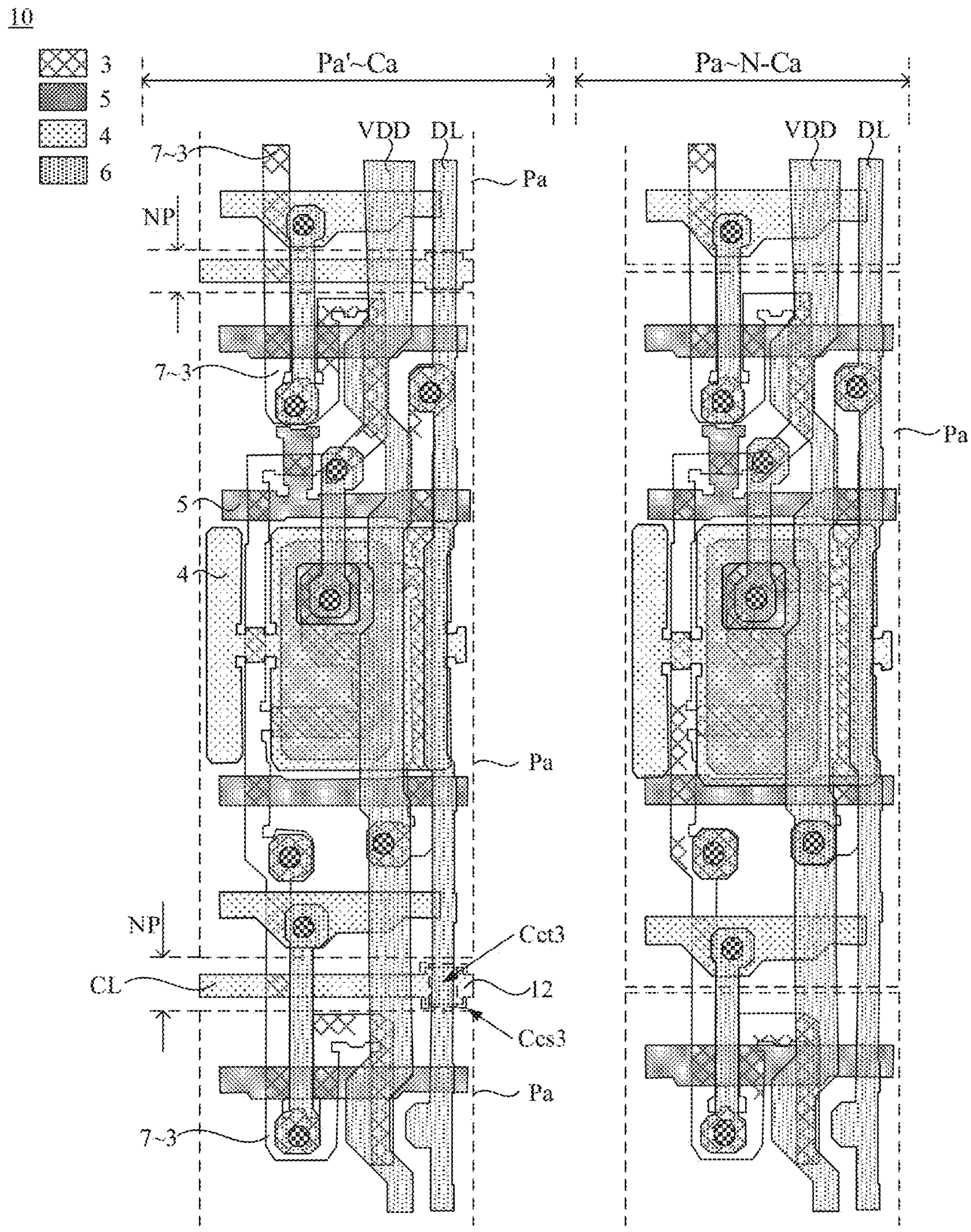
FIG. 22 is a structural diagram of a pixel region and a non-pixel region, in accordance with some embodiments of the present disclosure.

In yet other embodiments, as shown in FIG. 22, the array substrate 10 includes the plurality of pixel regions Pa arranged in the array, and each pixel region Pa is provided with a pixel driving circuit 11 therein. In the column direction of the sub-pixels arranged in the array, a size of the pixel region Pa in the compensation region Ca is less than a size of the pixel region Pa in the non-compensation region N-Ca. The plurality of data signal lines DL extend in the column direction, and pass through the display region. The compensation region Ca includes non-pixel region(s) NP not provided with the pixel driving circuit 11. The at least one compensation capacitor 12 is disposed in the non-pixel region(s) NP of the compensation region Ca.

In some examples, the compensation capacitor 12 is disposed in the compensation region Ca. The display region includes the pixel regions Pa each provided with at least one pixel driving circuit 11. A dimension of the pixel region Pa in the compensation region Ca in the column direction is less than a dimension of the pixel region in the non-compensation region N-Ca in the column direction, so that in the column direction, a distance between two adjacent pixel regions Pa in the compensation region Ca is greater than a distance between two adjacent pixel regions in the non-compensation region N-Ca. A space between two adjacent pixel regions Pa in the compensation region Ca is a non-pixel region NP, and the compensation capacitor 12 may be disposed in the non-pixel region NP.

For example, compensation capacitor(s) 12 include third voltage stabilization plate pattern(s) Ccs3. The third voltage stabilization plate pattern(s) Ccs3 may be arranged in the first gate layer 4, and third voltage stabilization plate pattern(s) Ccs3 are located in the non-pixel region NP. Moreover, the third voltage stabilization plate pattern Ccs3 is overlapped with a data signal line DL.

A voltage stabilization signal wiring CL is further provided in the non-pixel region NP provided with the third voltage stabilization plate pattern Ccs3. The voltage stabilization signal wiring CL is electrically connected to the third voltage stabilization plate pattern Ccs3 located in the same non-pixel region NP. The voltage stabilization signal wiring CL is configured to transmit the voltage stabilization signal. The voltage stabilization signal wiring CL may be electrically connected to the power supply voltage signal line VDD, the initialization signal line, or other wiring that provides the voltage stabilization signal.

In some embodiments, a portion of the data signal line DL that is overlapped with the third voltage stabilization plate pattern Ccs3 serves as a third load plate pattern Cct3 of the compensation capacitor 12. An area of an orthographic projection of the third voltage stabilization plate pattern Ccs3 on the substrate is greater than an area of an orthographic projection of the third load plate pattern Cct3 on the substrate.

For example, the area of the orthographic projection of the third voltage stabilization plate pattern Ccs3 on the substrate is 2 times the area of the orthographic projection of the third load plate pattern Cct3 on the substrate. The area of the orthographic projection of the third voltage stabilization plate pattern Ccs3 is larger, so that the third voltage stabilization plate pattern Ccs3 has sufficient activity margin during processing, which may meet the requirement for areas of opposite portions of the two plates of the compensation capacitor 12. Moreover, the third voltage stabilization plate pattern Ccs3 may be shifted within a certain range, so that the process difficulty is able to be effectively reduced.

In some examples, the number of pixels in each column in the compensation region is different, so that the number of compensation capacitor(s) 12 with which each data signal line DL needs to be provided is different, and each non-pixel region NP may be provided with a compensation capacitor 12 therein. That is, the number of non-pixel region(s) NP with which each column of pixel regions Pa needs to be provided is consistent with the number of compensation capacitor(s) 12 to which a data signal line DL passing through this column of pixel regions Pa is electrically connected. Since the load of the compensation capacitor 12 is different according to the size of the compensation capacitor 12, in a specific process, the number of compensation capacitor(s) 12 to which each data signal line is electrically connected is not determined, and is sufficient to meet that the load of each data signal line is uniform or substantially uniform as a reference.

Figure 23:
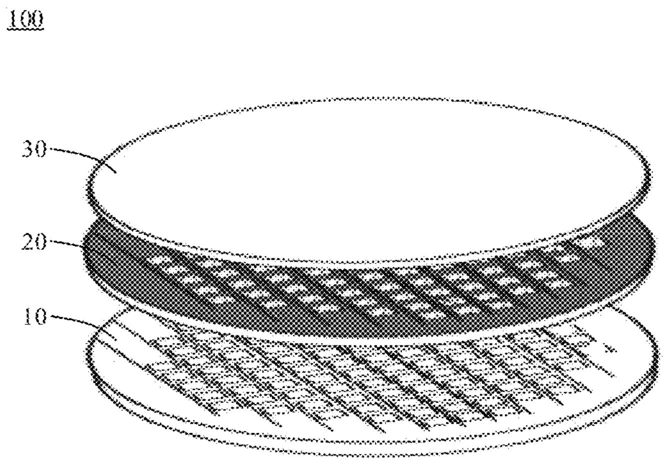
FIG. 23 is a structural diagram of another display panel, in accordance with some embodiments of the present disclosure.

On another hand, as shown in FIG. 23, some embodiments of the present disclosure provide the display panel 100. The display panel 100 includes the array substrate 10, the light-emitting device layer 20 and the encapsulation layer 30 in any one of the embodiments of the above aspect. The light-emitting device layer 20 is disposed on a side of the source-drain metal layer away from the substrate, and the encapsulation layer is disposed on a side of the light-emitting device layer away from the substrate.

The display panel provided in some embodiments of the present disclosure uses the array substrate in the above embodiments, and has the same effects and functions as the array substrate in the above embodiments, which will not be repeated here.

In yet another aspect, some embodiments of the present disclosure provide the display device 1000. The display device 1000 includes the display panel 100 in the embodiments of the above another aspect. The display device 1000 may be the watch as shown in FIG. 1, and includes the display panel 100 that is circular.

The display device provided in some embodiments of the present disclosure uses the display panel in the above embodiments, and has the same effects and functions as the display panel in the above embodiments, which will not be repeated here.

The foregoing descriptions are merely some specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. An array substrate having a display region, wherein a plurality of pixel driving circuits arranged in an array and a plurality of data signal lines are disposed in the display region, and a data signal line is electrically connected to a column of pixel driving circuits; the display region includes a compensation region and a non-compensation region; a plurality of compensation devices are disposed in the compensation region, and are configured to enable loads of the plurality of data signal lines in the display region to be uniform;

the array substrate comprising:

a substrate;

a first gate layer disposed on a side of the substrate; wherein the first gate layer includes at least one voltage stabilization plate pattern of at least one compensation device each configured to receive a voltage stabilization signal;

a source-drain metal layer disposed on a side of the first gate layer away from the substrate and including the plurality of data signal lines; wherein an orthographic projection of a voltage stabilization plate pattern of a compensation device in the at least one compensation device on the substrate is overlapped with an orthographic projection of a data signal line on the substrate;

wherein the display region includes a plurality of pixel regions, and each pixel region is provided with a pixel driving circuit therein; each of at least one pixel region is a compensation pixel region provided with a voltage stabilization plate pattern of a compensation device in the at least one compensation device therein; the voltage stabilization plate pattern in the compensation pixel region is overlapped with a data signal line passing through the compensation pixel region, and an overlapping portion of the voltage stabilization plate pattern in the compensation pixel region and the data signal line passing through the compensation pixel region constitutes the compensation device.

2. The array substrate according to claim 1, wherein the at least one voltage stabilization plate pattern includes a first voltage stabilization plate pattern;

the first gate layer further includes initialization signal lines; and the first voltage stabilization plate pattern is electrically connected to an initialization signal line.

3. The array substrate according to claim 2, wherein the pixel driving circuit includes a first enable transistor and a second reset transistor;

the array substrate further comprises:

a semiconductor layer including a plurality of active patterns; wherein each active pattern is located in a pixel region, and the active pattern includes at least an active layer of the first enable transistor and an active layer of the second reset transistor; and a second gate layer disposed between the semiconductor layer and the first gate layer; wherein the second gate layer includes first gate signal lines and second gate signal lines; a first gate signal line is overlapped with the active layer of the first enable transistor, and a second gate signal line is overlapped with the active layer of the second reset transistor; wherein an orthographic projection of the first voltage stabilization plate pattern on the substrate is located between orthographic projections of the first gate signal line and the second gate signal line on the substrate.

4. The array substrate according to claim 3, wherein a width of a portion of the first gate signal line located in the compensation region is less than a width of a portion of the first gate signal line located in the non-compensation region; and a width of a portion of the second gate signal line located in the compensation region is less than a width of a portion of the second gate signal line located in the non-compensation region.

5. The array substrate according to claim 3, wherein orthographic projections of the plurality of active patterns in the semiconductor layer on the substrate are non-overlapped with at least one orthographic projection of the at least one voltage stabilization plate pattern on the substrate.

6. The array substrate according to claim 2, wherein a portion of a data signal line that is overlapped with the first voltage stabilization plate pattern serves as a first load plate pattern of a compensation device in the at least one compensation device; and an area of an orthographic projection of the first voltage stabilization plate pattern on the substrate is greater than an area of an orthographic projection of the first load plate pattern on the substrate.

7. The array substrate according to claim 1, wherein the at least one voltage stabilization plate pattern includes a second voltage stabilization plate pattern;

the source-drain metal layer further includes power supply voltage signal lines; and the second voltage stabilization plate pattern is electrically connected to a power supply voltage signal line.

8. The array substrate according to claim 7, wherein the pixel driving circuit includes a writing transistor and a first reset transistor;

the array substrate further comprises:

a semiconductor layer including a plurality of active patterns; wherein each active pattern is located in a pixel region, and the active pattern includes at least an active layer of the first reset transistor and an active layer of the writing transistor; and a second gate layer disposed between the semiconductor layer and the first gate layer; wherein the second gate layer includes third gate signal lines and fourth gate signal lines; a third gate signal line is overlapped with the active layer of the first reset transistor, and a fourth gate signal line is overlapped with the active layer of the writing transistor; wherein an orthographic projection of the second voltage stabilization plate pattern on the substrate is located between orthographic projections of the third gate signal line and the fourth gate signal line on the substrate.

9. The array substrate according to claim 8, wherein a width of a portion of the third gate signal line located in the compensation region is less than a width of a portion of the third gate signal line located in the non-compensation region; and a width of a portion of the fourth gate signal line located in the compensation region is less than a width of a portion of the fourth gate signal line located in the non-compensation region.

10. The array substrate according to claim 8, wherein orthographic projections of the plurality of active patterns in the semiconductor layer on the substrate are non-overlapped with at least one orthographic projection of the at least one voltage stabilization plate pattern on the substrate.

11. The array substrate according to claim 7, wherein a portion of a data signal line that is overlapped with the second voltage stabilization plate pattern serves as a second load plate pattern of a compensation device in the at least one compensation device; and an area of an orthographic projection of the second voltage stabilization plate pattern on the substrate is greater than an area of an orthographic projection of the second load plate pattern on the substrate.

12. The array substrate according to claim 1, wherein the array substrate further has a peripheral region disposed on at least on one side of the display region; a plurality of power supple voltage signal lines are further disposed in the display region, and a power supply voltage bus and a plurality of data signal extending lines are disposed in the peripheral region; wherein the plurality of power supply voltage signal lines extend into the peripheral region, and are electrically connected to the power supply voltage bus; and the plurality of data signal lines extend into the peripheral region; each data signal line is electrically connected to a data signal extending line, and orthographic projections of at least some of the plurality of data signal extending lines on the substrate are overlapped with an orthographic projection of the power supply voltage bus on the substrate.

13. The array substrate according to claim 1, wherein the pixel regions are arranged in an array, and a data signal line passes through a column of pixel regions; in a column of pixel regions in the compensation region, at least one compensation pixel region and at least one non-compensation pixel region except the at least one compensation pixel region are alternately arranged.

14. The array substrate according to claim 1, wherein the plurality of pixel regions are arranged in an array; in a column direction of the pixel regions arranged in the array, a dimension of a pixel region located in the compensation region is less than a dimension of a pixel region located in the non-compensation region;

the plurality of data signal lines extend in the column direction, and pass through the display region; the compensation region includes at least one non-pixel region not provided with a pixel driving circuit therein; two adjacent pixel regions in the compensation region are provided with a non-pixel region therebetween; and the at least one compensation device is disposed in the at least one non-pixel region of the compensation region.

15. The array substrate according to claim 14, wherein the at least one voltage stabilization plate pattern includes a third voltage stabilization plate pattern located in the non-pixel region;

a voltage stabilization signal wiring is further disposed in the non-pixel region, and is configured to transmit the voltage stabilization signal; and the third voltage stabilization plate pattern is electrically connected to the voltage stabilization signal wiring.

16. The array substrate according to claim 15, wherein a portion of a data signal line that is overlapped with the third voltage stabilization plate pattern serves as a third load plate pattern of a compensation device in the at least one compensation device; and an area of an orthographic projection of the third voltage stabilization plate pattern on the substrate is greater than an area of an orthographic projection of the third load plate pattern on the substrate.

17. A display panel, comprising:

the array substrate according to claim 1;

a light-emitting device layer disposed on a side of the source-drain metal layer away from the substrate; and an encapsulation layer disposed on a side of the light-emitting device layer away from the substrate.

18. A display device, comprising the display panel according to claim 17.

19. The array substrate according to claim 1, wherein the at least one voltage stabilization plate pattern includes a first voltage stabilization plate pattern and a second voltage stabilization plate pattern;

the first gate layer further includes initialization signal lines, and the source-drain metal layer further includes power supply voltage signal lines; and the first voltage stabilization plate pattern is electrically connected to an initialization signal line, and the second voltage stabilization plate pattern is electrically connected to a power supply voltage signal line.

* * * * *